(12) United States Patent
Arimilli et al.

(10) Patent No.: US 8,351,200 B2
(45) Date of Patent: *Jan. 8, 2013

(54) CONVERGENCE OF AIR WATER COOLING OF AN ELECTRONICS RACK AND A COMPUTER ROOM IN A SINGLE UNIT

(75) Inventors: Ravi K. Arimilli, Austin, TX (US); Michael J. Ellsworth, Jr., Lagrangeville, NY (US); Edward J. Seminaro, Milton, NY (US)

(73) Assignee: International Business Machines Corporation, Armonk, NY (US)

( * ) Notice: Subject to any disclaimer, the term of this patent is extended or adjusted under 35 U.S.C. 154(b) by 931 days.

This patent is subject to a terminal disclaimer.

(21) Appl. No.: 12/425,226

(22) Filed: Apr. 16, 2009

(65) Prior Publication Data

US 2010/0067193 A1    Mar. 18, 2010

Related U.S. Application Data

(63) Continuation-in-part of application No. 11/942,207, filed on Nov. 19, 2007, now Pat. No. 7,757,506.

(51) Int. Cl.
*G06F 1/20* (2006.01)
(52) U.S. Cl. ............... 361/679.53; 62/259.2; 165/80.4; 165/104.33
(58) Field of Classification Search ............... 62/259.2; 165/80.4, 104.33; 361/679.53, 69, 698
See application file for complete search history.

(56) References Cited

U.S. PATENT DOCUMENTS

| 3,754,596 | A | 8/1973 | Ward, Jr. |
| 5,144,811 | A | 9/1992 | Brodie et al. |
| 5,198,962 | A | 3/1993 | Tyson |
| 5,509,468 | A | 4/1996 | Lopez |
| 6,269,650 | B1 | 8/2001 | Shaw |

(Continued)

FOREIGN PATENT DOCUMENTS
DE    19845821 B4    4/2000

OTHER PUBLICATIONS

Arimilli et al., "Environmental Control of Liquid Cooled Electronics", U.S. Appl. No. 12/425,210, filed Apr. 16, 2009.

(Continued)

*Primary Examiner* — Cheryl J Tyler
*Assistant Examiner* — Jonathan Bradford
(74) *Attorney, Agent, or Firm* — Matthew B. Talpis, Esq.; Kevin P. Radigan, Esq.; Heslin Rothenberg Farley & Mesiti P.C.

(57) ABSTRACT

Systems and methods are provided for cooling an electronics rack and a computer room from a single unit, which includes a heat-generating electronics subsystem across which air flows from an air inlet to an air outlet side of the rack. First and second modular cooling units (MCUs) are associated with the rack and configured to provide system coolant to the electronics subsystem for cooling thereof. System coolant supply and return manifolds are in fluid communication with the MCUs for facilitating providing of system coolant to the electronics subsystem, and to an air-to-liquid heat exchanger associated with the rack for exclusively cooling air passing through the rack, as well as conditioning the ambient air of the computer room. Such cooling is exclusive of an outside-of-rack conditioned air unit.

20 Claims, 14 Drawing Sheets

U.S. PATENT DOCUMENTS

| | | | |
|---|---|---|---|
| 6,349,391 | B1 | 2/2002 | Petivan et al. |
| 6,374,627 | B1 | 4/2002 | Schumacher et al. |
| 6,494,050 | B2 | 12/2002 | Spinazzola et al. |
| 6,587,343 | B2 | 7/2003 | Novotny et al. |
| 6,763,880 | B1 | 7/2004 | Shih |
| 6,854,284 | B2 | 2/2005 | Bash et al. |
| 6,854,287 | B2 | 2/2005 | Patel et al. |
| 6,867,970 | B2 | 3/2005 | Muller et al. |
| 6,927,980 | B2 | 8/2005 | Fukuda et al. |
| 7,002,799 | B2 | 2/2006 | Malone et al. |
| 7,011,143 | B2 | 3/2006 | Corrado et al. |
| 7,051,802 | B2 * | 5/2006 | Baer ............................. 165/299 |
| 7,104,081 | B2 | 9/2006 | Chu et al. |
| 7,106,590 | B2 | 9/2006 | Chu et al. |
| 7,110,260 | B2 | 9/2006 | Weber et al. |
| 7,236,363 | B2 | 6/2007 | Belady |
| 7,315,448 | B1 | 1/2008 | Bash et al. |
| 7,400,505 | B2 | 7/2008 | Campbell et al. |
| 7,599,184 | B2 * | 10/2009 | Upadhya et al. ............. 361/699 |
| 7,641,101 | B2 | 1/2010 | Campbell et al. |
| 7,757,506 | B2 * | 7/2010 | Ellsworth et al. ............ 62/259.2 |
| 2003/0183562 | A1 | 10/2003 | Pahl et al. |
| 2004/0221604 | A1 | 11/2004 | Ota et al. |
| 2005/0061541 | A1 | 3/2005 | Belady |
| 2006/0002086 | A1 | 1/2006 | Teneketges et al. |
| 2006/0090494 | A1 | 5/2006 | Manole et al. |
| 2007/0101334 | A1 | 5/2007 | Atyam et al. |
| 2007/0119569 | A1 | 5/2007 | Campbell et al. |
| 2007/0213881 | A1 | 9/2007 | Belady et al. |
| 2007/0227710 | A1 | 10/2007 | Belady et al. |
| 2008/0034761 | A1 | 2/2008 | Hartley |
| 2009/0086428 | A1 | 4/2009 | Campbell et al. |
| 2009/0086432 | A1 | 4/2009 | Campbell et al. |
| 2009/0126909 | A1 | 5/2009 | Ellsworth, Jr. et al. |
| 2009/0126910 | A1 | 5/2009 | Campbell et al. |
| 2010/0263855 | A1 | 10/2010 | Arimilli et al. |

OTHER PUBLICATIONS

Morgan, "IBM Hints at Triple Redundancy in Power6," Mar. 29, 2006, (http://www.itjungle.com/breaking/bn032906-story01.html).

Arent, "Liquid Coolant Distribution Unit with Convertible Air or Water Cooling", IBM Technical Disclosure Bulletin, IP Prior Art Database, IP.com No. IPCOM000044828D (Feb. 6, 2005).

Delia et al., "System Cooling Design for the Water-Cooled IBM Enterprise System/900 Processors", IBM Journal of Research and Development, vol. 36, No. 4, pp. 791-803 (Jul. 1992).

Campbell et al., Office Action for U.S. Serial no. 11/942,221 (U.S. Patent Publication No. 2009/0126910 Al), dated Jun. 27, 2011.

Arimilli et al, Office Action for U.S. Appl. No. 12/425,210 (U.S. Patent Publication No. 2010/0263855 A1), dated Jul. 5, 2012.

* cited by examiner

CONVERGENCE OF AIR WATER COOLING OF AN ELECTRONICS RACK AND A COMPUTER ROOM IN A SINGLE UNIT

PRIORITY CLAIM

The present application is a continuation-in-part of U.S. patent application Ser. No. 11/942,207, filed Nov. 19, 2007, and entitled "System and Method for Facilitating Cooling of a Liquid-Cooled Electronics Rack." Benefit of priority is hereby claimed under 35 U.S.C. §120 to U.S. patent application Ser. No. 11/942,207, which is incorporated by reference herein in its entirety and for all purposes.

CROSS REFERENCE TO RELATED APPLICATIONS

The present application is related to the following United States patent application, which is hereby incorporated by reference in its entirety:

1) U.S. patent application Ser. No. 12/425,210

This invention was made with United States Government support under Agreement No. HR0011-07-9-0002 awarded by DARPA. The Government has certain rights in this invention.

TECHNICAL FIELD

The present invention relates in general to apparatuses and methods for facilitating operation of liquid-cooled, rack-mounted assemblages of individual electronics units, such as rack-mounted computer server units.

BACKGROUND OF THE INVENTION

The power dissipation of integrated circuit chips, and the modules containing the chips, continues to increase in order to achieve increases in processor performance. This trend poses a cooling challenge at both module and system level. Increased airflow rates are needed to effectively cool high power modules and to limit the temperature of the air that is exhausted into the computer center.

In many large server applications, processors along with their associated electronics (e.g., memory, disk drives, power supplies, etc.) are packaged in removable drawer configurations stacked within a rack or frame. In other cases, the electronics may be in fixed locations within the rack or frame. Typically, the components are cooled by air moving in parallel airflow paths, usually front-to-back, impelled by one or more air moving devices (e.g., fans or blowers). In some cases it may be possible to handle increased power dissipation within a single drawer by providing greater airflow, through the use of a more powerful air moving device or by increasing the rotational speed (i.e., RPMs) of an existing air moving device. However, this approach is becoming problematic at the rack level in the context of a computer installation (i.e., data center).

The sensible heat load carried by the air exiting the rack is stressing the availability of the computer room air-conditioning to effectively handle the load. This is especially true for large installations with "server farms" or large banks of computer racks close together. In such installations, liquid cooling (e.g., water cooling) is an attractive technology to manage the higher heat fluxes. The liquid absorbs the heat dissipated by the components/modules in an efficient manner. Typically, the heat is ultimately transferred from the liquid to an outside environment, whether air or other liquid coolant.

SUMMARY OF THE INVENTION

The shortcomings of the prior art are overcome and additional advantages are provided through provision of a system for facilitating cooling of electronics. The system includes: an electronics rack; at least two modular cooling units (MCUs); an air-to-liquid heat exchanger; at least one isolation valve; and at least one controller. The electronics rack includes at least one heat-generating electronics subsystem and includes an air inlet side and an air outlet side for respectively enabling ingress and egress of external air. The MCUs are associated with the electronics rack and are configured to provide system coolant in parallel to the at least one heat-generating electronics subsystem for facilitating cooling thereof. Each MCU includes a liquid-to-liquid heat exchanger, a first coolant loop and a second coolant loop. When operational, the first coolant loop of each MCU receives chilled coolant from a source and passes at least a portion thereof through the liquid-to-liquid heat exchanger, and the second coolant loop provides cooled system coolant to the at least one heat-generating electronics subsystem, and expels heat in the liquid-to-liquid heat exchanger from the at least one heat-generating electronics subsystem to the chilled coolant in the first coolant loop. The air-to-liquid heat exchanger is coupled to receive system coolant from the at least two MCUs and exhaust coolant to the at least two MCUs. The at least one isolation valve is coupled to selectively shut off the flow of system coolant through the air-to-liquid heat exchanger. The at least one controller is coupled to the at least one isolation valve for automatically shutting off the flow of system coolant through the air-to-liquid heat exchanger upon detection of a failure at one MCU of the at least two MCUs. When operational, the at least two MCUs provide cooled system coolant in parallel to the at least one heat-generating electronics subsystem, for liquid cooling thereof, and to the air-to-liquid heat exchanger, for exclusively cooling air passing through the electronics rack. Such cooling is exclusive of an outside-of-rack conditioned air unit. Responsive to detection of failure at one MCU of the at least two MCUs, the at least one controller employs the at least one isolation valve to automatically shut off flow of system coolant through the air-to-liquid heat exchanger while system coolant continues to flow via at least one remaining operational MCU for continued liquid cooling thereof.

In another aspect, a data center is provided which includes a plurality of electronics racks and a plurality of cooling systems. Each electronics rack includes at least one heat-generating electronics subsystem, and an air inlet side and air outlet side for respectively enabling ingress and egress of external air. Each cooling system is associated with a respective electronics rack, and includes: at least two modular cooling units (MCUs) associated with the electronics rack and configured to provide system coolant in parallel to the at least one heat-generating electronics subsystem for facilitating cooling thereof; an air-to-liquid heat exchanger associated with the electronics rack for exclusively cooling air passing through the electronics rack; at least one isolation valve coupled to selectively shut off flow of system coolant through the air-to-liquid heat exchanger; and at least one controller coupled to the at least one isolation valve for automatically shutting off flow of system coolant through the air-to-liquid heat exchanger upon detection of a failure at one MCU of the at least two MCUs. Each MCU of the at least two MCUs includes a liquid-to-liquid heat exchanger, a first coolant loop and a second coolant loop. When operational, the first coolant loop of each MCU receives chilled coolant from a source and passes at least a portion thereof through the liquid-to-liquid heat exchanger, and the second coolant loop provides cooled system coolant to the at least one heat-generating electronics subsystem, and expels heat via the liquid-to-liquid heat exchanger from the at least one heat-generating electronics subsystem of the associated electronics rack to the chilled coolant in the first coolant loop. Further, the at least two MCUs supply system coolant in parallel to the air-to-liquid heat exchanger and receive exhausted system coolant from the air-to-liquid heat exchanger. Thus, when operational, the at least two MCUs provide cooled system coolant in parallel to the at least one heat-generating electronics subsystem of the associated electronics rack, for liquid cooling thereof, and to the air-to-liquid heat exchanger for exclusively cooling air passing through the associated electronics rack. Such cooling is exclusive of an outside-of-rack conditioned air unit. Responsive to detection of failure at one MCU of the at least two MCUs, the at least one controller employs the at least one isolation valve to automatically shut off flow of system coolant through the air-to-liquid heat exchanger, while system coolant continues to flow from the at least one remaining operational MCU to the at least one heat-generating electronics subsystem of the associated electronics rack for continued liquid cooling thereof.

In a further aspect, a method of facilitating cooling of an electronics rack is provided. The method includes: cooling at least one heat-generating electronics subsystem of an electronics rack, the electronics rack including an air inlet side and an air outlet side respectively enabling ingress and egress of external air, the cooling comprising: employing at least two modular cooling units (MCUs) in association with the electronics rack to provide system coolant in parallel to the at least one heat-generating electronics subsystem thereof, each MCU of the at least two MCUs including a liquid-to-liquid heat exchanger, a first coolant loop and a second coolant loop, and when operational, the first coolant loop of each MCU receives chilled coolant from a source and passes at least a portion thereof through the liquid-to-liquid heat exchanger, and the second coolant loop provides cooled system coolant to the at least one heat-generating electronics subsystem of the electronics rack, and expels heat in the liquid-to-liquid heat exchanger from the at least one heat-generating electronics subsystem to the chilled coolant in the first coolant loop; and utilizing an air-to-liquid heat exchanger disposed in association with the electronics rack for exclusively cooling air passing through the electronics rack, the air-to-liquid heat exchanger being coupled to receive system coolant from the at least two MCUs and exhaust system coolant to the at least two MCUs, wherein the air-to-liquid heat exchanger cools air passing through the electronics rack exclusive of outside-of-rack conditioned air units; and monitoring for failure of an MCU of the at least two MCUs, and upon detection of failure of one MCU of the at least two MCUs, automatically shutting off system coolant flow through the air-to-liquid heat exchanger while continuing to provide system coolant flow, via at least one remaining operational MCU, to the at least one heat-generating electronics subsystem.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION OF THE INVENTION

Figure 1:
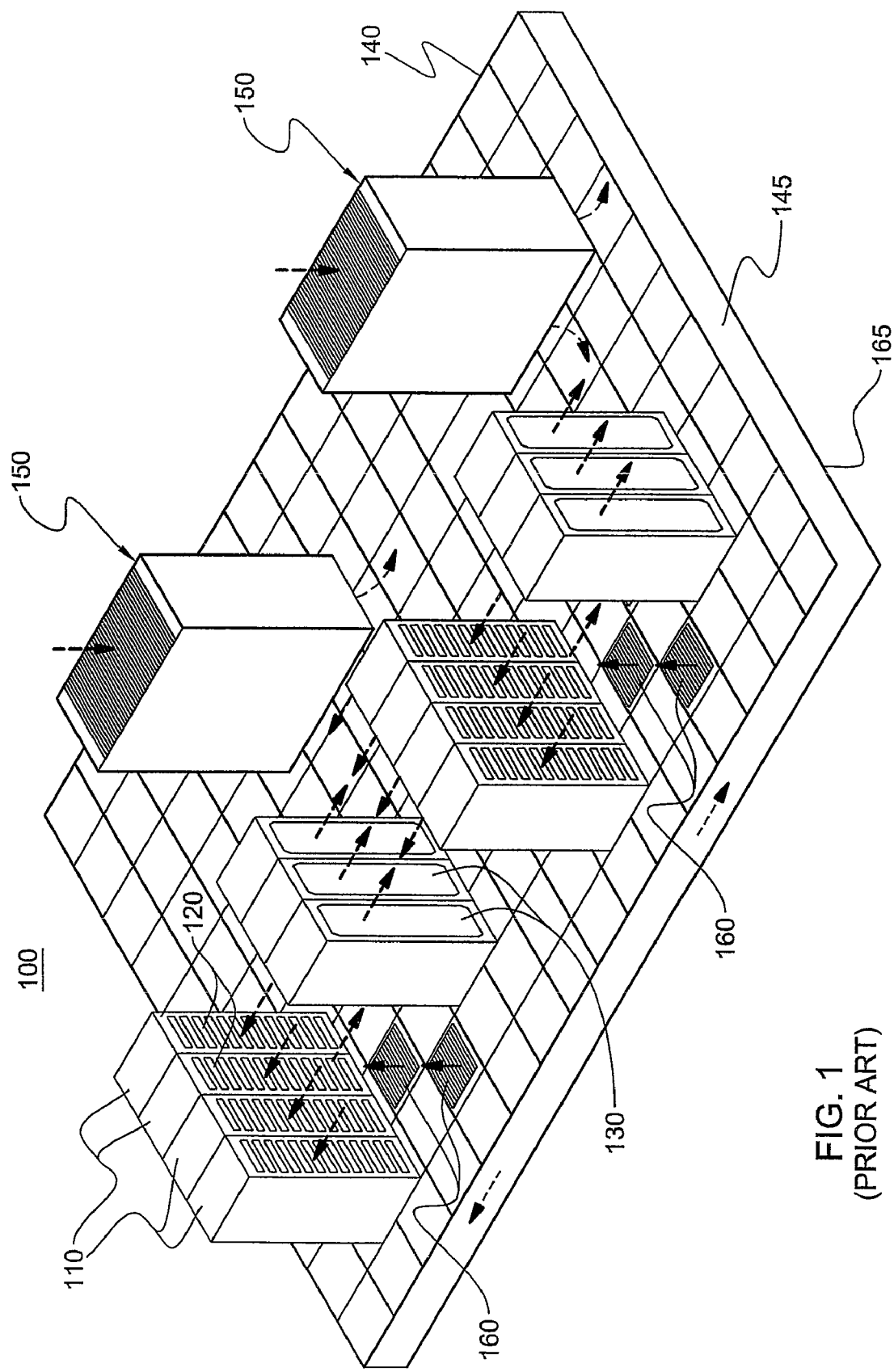
FIG. 1 depicts one embodiment of a conventional raised floor layout of an air-cooled computer installation.

As used herein, the terms "electronics rack," "rack-mounted electronic equipment," and "rack unit" are used interchangeably, and unless otherwise specified include any housing, frame, rack, compartment, blade server system, etc., having one or more heat-generating components of a computer system or electronics system, and may be, for example, a stand alone computer processor having high, mid or low end processing capability. In one embodiment, an electronics rack may comprise multiple electronics subsystems, each having one or more heat-generating components disposed therein requiring cooling. "Electronics subsystem" refers to any sub-housing, blade, book, drawer, node, compartment, etc., having one or more heat-generating electronic components disposed therein. Each electronics subsystem of an electronics rack may be movable or fixed relative to the electronics rack, with the rack-mounted electronics drawers of a multidrawer rack unit and blades of a blade center system being two examples of subsystems of an electronics rack to be cooled.

"Electronic component" refers to any heat-generating electronic component of, for example, a computer system or other electronics unit requiring cooling. By way of example, an electronic component may comprise one or more integrated circuit dies and/or other electronic devices to be cooled, including one or more processor dies, memory dies and memory support dies. As a further example, the electronic component may comprise one or more bare dies or one or more packaged dies disposed on a common carrier. As used herein, "primary heat-generating component" refers to a primary heat-generating electronic component within an electronics subsystem, while "secondary heat-generating component" refers to an electronic component of the electronics subsystem generating less heat than the primary heat-generating component to be cooled. "Primary heat-generating die" refers, for example, to a primary heat-generating die or chip within a heat-generating electronic component comprising primary and secondary heat-generating dies (with a processor die being one example). "Secondary heat-generating die" refers to a die of a multi-die electronic component generating less heat than the primary heat-generating die thereof (with memory dies and memory support dies being examples of secondary dies to be cooled). As one example, a heat-generating electronic component could comprise multiple primary heat-generating bare dies and multiple secondary heat-generating dies on a common carrier. Further, unless otherwise specified herein, the term "liquid-cooled cold plate" refers to any conventional thermally conductive structure having a plurality of channels or passageways formed therein for flowing of liquid coolant there through. In addition, "metallurgically bonded" refers generally herein to two components being welded, brazed or soldered together by any means.

As used herein, "air-to-liquid heat exchange assembly" means any heat exchange mechanism characterized as described herein through which liquid coolant can circulate; and includes, one or more discrete air-to-liquid heat exchangers coupled either in series or in parallel. An air-to-liquid heat exchanger may comprise, for example, one or more coolant flow paths, formed of thermally conductive tubing (such as copper or other tubing) in thermal or mechanical contact with a plurality of air-cooled cooling fins. Size, configuration and construction of the air-to-liquid heat exchange assembly and/or air-to-liquid heat exchanger thereof can vary without departing from the scope of the invention disclosed herein. A "liquid-to-liquid heat exchanger" may comprise, for example, two or more coolant flow paths, formed of thermally conductive tubing (such as copper or other tubing) in thermal or mechanical contact with each other. Size, configuration and construction of the liquid-to-liquid heat exchanger can vary without departing from the scope of the invention disclosed herein. Further, "data center" refers to a computer installation containing one or more electronics racks to be cooled. As a specific example, a data center may include one or more rows of rack-mounted computing units, such as server units.

One example of facility coolant and system coolant is water. However, the concepts disclosed herein are readily adapted to use with other types of coolant on the facility side and/or on the system side. For example, one or more of the coolants may comprise a brine, a fluorocarbon liquid, a liquid metal, or other similar coolant, or refrigerant, while still maintaining the advantages and unique features of the present invention.

Reference is made below to the drawings, which are not drawn to scale for reasons of understanding, wherein the same reference numbers used throughout different figures designate the same or similar components.

As shown in FIG. 1, in a raised floor layout of an air cooled computer installation 100 typical in the prior art, multiple electronics racks 110 are disposed in one or more rows. A computer installation such as depicted in FIG. 1 may house several hundred, or even several thousand microprocessors. In the arrangement of FIG. 1, chilled air enters the computer room via floor vents from a supply air plenum 145 defined between the raised floor 140 and a base or sub-floor 165 of the computer room. Cooled air is taken in through louvered covers at air inlet sides 120 of the electronics racks and expelled through the back (i.e., air outlet sides 130) of the electronics racks. Each electronics rack 110 may have an air moving device (e.g., fan or blower) to provide forced inlet-to-outlet air flow to cool the electronic components within the drawer(s) of the rack. The supply air plenum 145 provides conditioned and cooled air to the air inlet sides of the electronics racks via perforated floor tiles 160 disposed in a "cold" aisle of the computer installation. The conditioned and cooled air is supplied to plenum 145 by one or more conditioned air units 150, also disposed within the computer installation 100. Computer room air is taken into each conditioned air unit 150 near an upper portion thereof. This computer room air comprises in part exhausted air from the "hot" aisles of the computer installation defined by opposing air outlet sides 130 of the electronics racks 110.

Figure 2A:
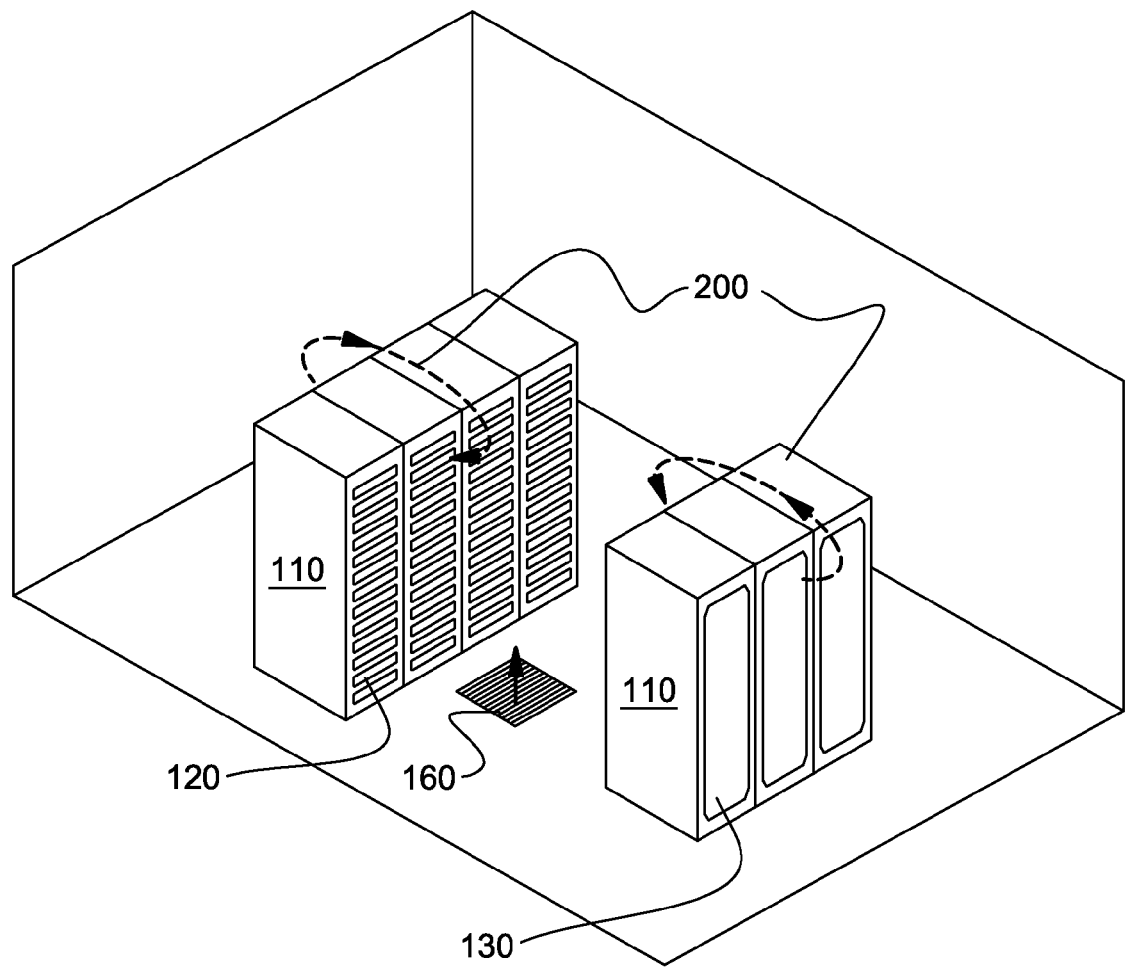
FIG. 2A depicts one problem addressed by the present invention, showing recirculation airflow patterns in one implementation of a raised floor layout of an air-cooled computer installation, in accordance with an aspect of the present invention.

Due to the ever increasing air flow requirements through electronics racks, and limits of air distribution within the typical computer room installation, recirculation problems within the computer room may occur. This is shown in FIG. 2A for a raised floor layout, wherein hot air recirculation 200 occurs from the air outlet sides 130 of the electronics racks back to the cold air aisle defined by the opposing air inlet sides 120 of the electronics rack. This recirculation can occur because the conditioned air supplied through tiles 160 is typically only a fraction of the air flow rate forced through the electronics racks by the air moving devices disposed therein.

This can be due, for example, to limitations on the tile sizes (or diffuser flow rates). The remaining fraction of the supply of inlet side air is often made up by ambient computer room air through recirculation 200. This re-circulating flow is often very complex in nature, and can lead to significantly higher rack unit inlet temperatures than might be expected.

The recirculation of hot exhaust air from the hot aisle of the computer room installation to the cold aisle can be detrimental to the performance and reliability of the computer system(s) or electronic system(s) within the racks. Data center equipment is typically designed to operate with rack air inlet temperatures in the 18-35° C. range. For a raised floor layout such as depicted in FIG. 1, however, temperatures can range from 1520° C. at the lower portion of the rack, close to the cooled air input floor vents, to as much as 45-50° C. at the upper portion of the electronics rack, where the hot air can form a self-sustaining recirculation loop. Since the allowable rack heat load is limited by the rack inlet air temperature at the "hot" part, this temperature distribution correlates to a lower processing capacity. Also, computer installation equipment almost always represents a high capital investment to the customer.

Figure 2B:
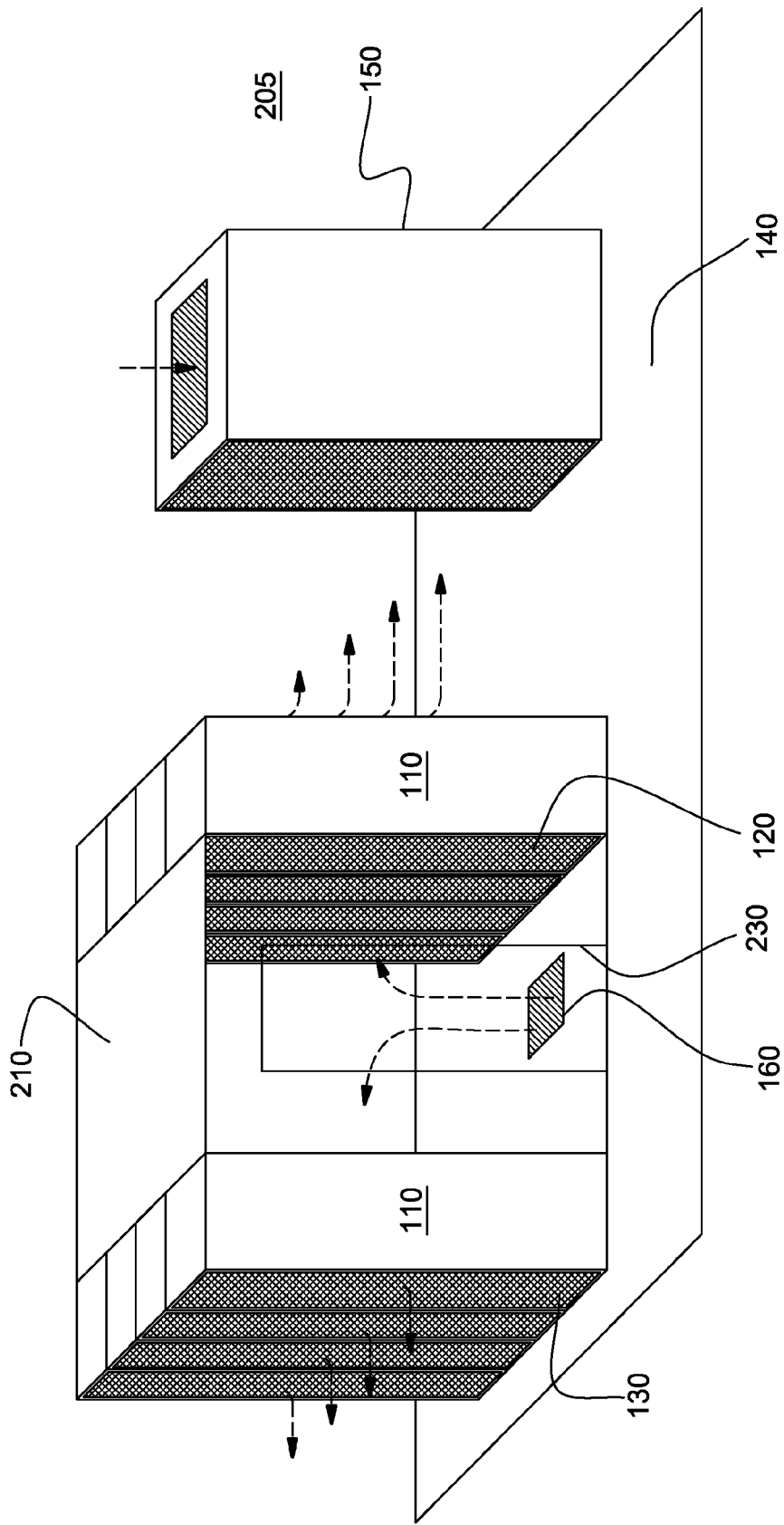
FIG. 2B depicts one problem addressed by the present invention, showing circulation airflow patters in one implementation of a raised floor layout of an air-cooled computer installation, in accordance with an aspect of the present invention.

To prevent the recirculation of hot exhaust air from the hot aisle of the computer room installation to the cold aisle, typical computer room installations for a raised floor layout have attempted to isolate the cold aisle air that is supplied to the electronics rack via perforated floor tiles 160 on raised floor 140, from the hot aisle air that is exhausted from the electronics rack. Referring now to FIG. 2B, shown is a typical computer room installation 205 having an cold aisle air containment system 210. The cold aisle air containment system 210 is installed around the cold air aisle such that the hot aisle air that is exhausted through air outlet sides 130 is not permitted to recirculate as inlet side air through air inlet sides 120. The aisle air containment system 210 can be installed to a drop ceiling, floors, or server cabinet tops. Moreover, such air containment solutions can be comprised of insulated curtain barriers (as manufactured by Data Center Resources, LLC of Estero, F L under the trademark Coolshield™), or more finished and aesthetically pleasing cold/hot air walled systems (as manufactured by Rittal GmbH & Co. KG of Herborn, Germany). According to the embodiment shown in FIG. 2B, an entryway to cold aisle air containment system 210 can be accessed by a built-in door 230. While such cold aisle air containment system prevents hot air recirculation with cold air, the hot aisle air that is exhausted from the server rack continues to tax the efficiency of conditioned air units 150. Moreover, hot aisle areas within a computer room serve as unpleasant working environments for technicians who may need to access such areas from time to time.

Thus, it is of significant importance, from a product reliability and performance view point, and from a customer satisfaction and business perspective, to (1) maintain the temperature of the rack inlet air uniform, (2) maintain a constant temperature throughout the various aisles of a computer room, and (3) obviate the need for outside-of-rack conditioned air units 150. The efficient cooling of such computer and electronic systems, and the amelioration of localized hot air inlet temperatures to one or more rack units due to recirculation of air currents, are addressed by the apparatuses and methods disclosed herein.

Figure 3:
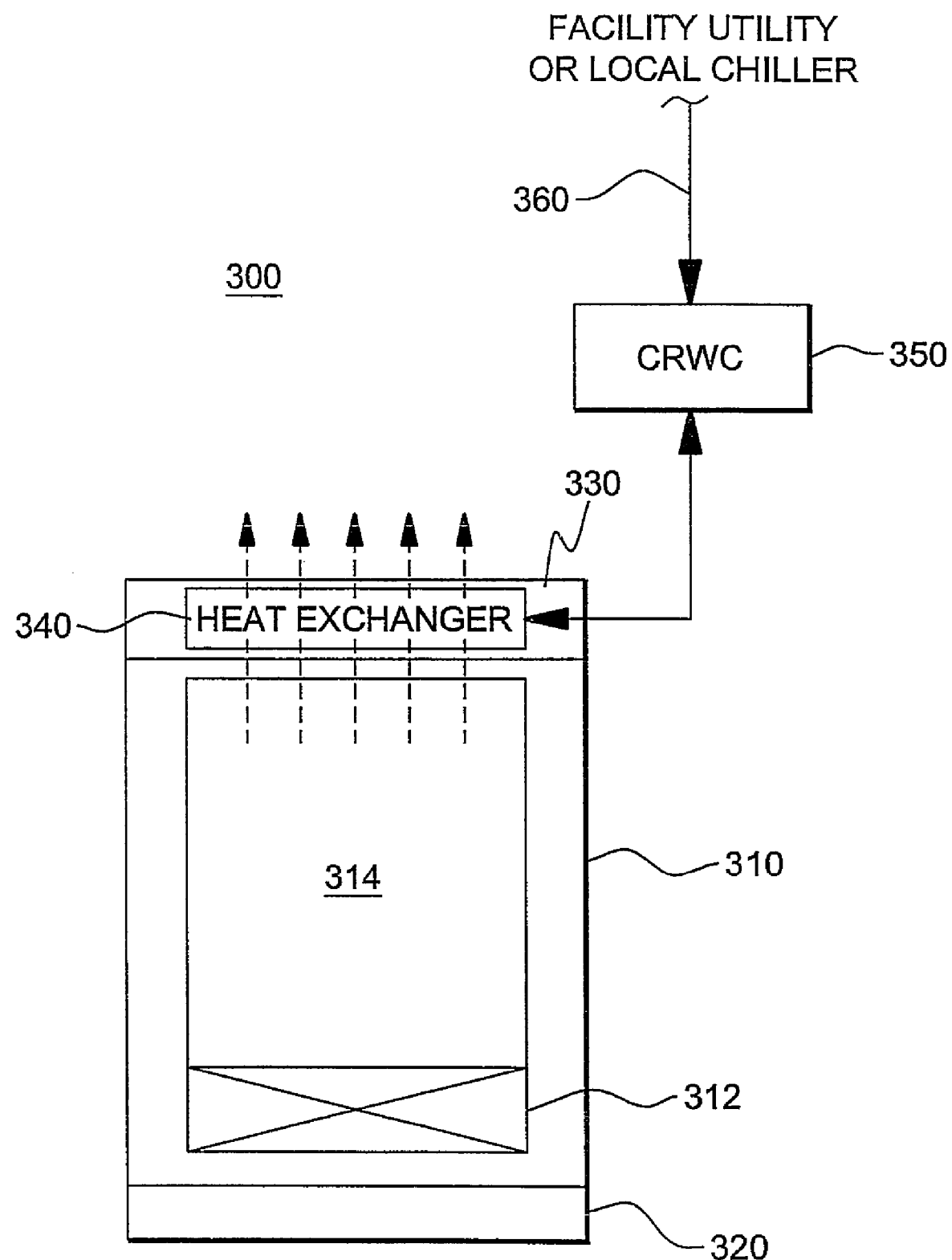
FIG. 3 is a cross-sectional plan view of one embodiment of an electronics rack utilizing at least one air-to-liquid heat exchanger disposed at the air outlet side of the electronics rack, in accordance with an aspect of the present invention.

FIG. 3 depicts one embodiment of a cooled electronics system, generally denoted 300, in accordance with an aspect of the present invention. In this embodiment, electronics system 300 includes an electronics rack 310 having an inlet door cover 320 and an outlet door cover 330 which have openings to allow for the ingress and egress of external air from the inlet side to the outlet side of the electronics rack 310. The system further includes at least one air moving device 312 for moving external air across at least one electronics drawer unit 314 positioned within the electronics rack. Disposed within outlet door cover 330 is a heat exchange assembly 340. Heat exchange assembly 340 includes an air-to-liquid heat exchanger through which the inlet-to-outlet air flow through the electronics rack passes. A computer room water conditioner (CRWC) 350 is used to buffer heat exchange assembly 340 from the building utility or local chiller coolant 360, which is provided as input to CRWC 350. The CRWC 350 provides system water or system coolant to heat exchange assembly 340. Heat exchange assembly 340 removes heat from the exhausted inlet-to-outlet air flow through the electronics rack for transfer via the system water or coolant to CRWC 350. Advantageously, providing a heat exchange assembly with an air-to-liquid heat exchanger such as disclosed herein at the outlet door cover of one or more electronics racks in a computer installation eliminates heat loads on the current computer room air supply within the computer installation. Thus, the air-to-liquid heat exchanger obviates the need for existing air conditioning units, while facilitating the cooling of computer room air that is recirculated into the rack-mounted electronics units.

Figure 4:
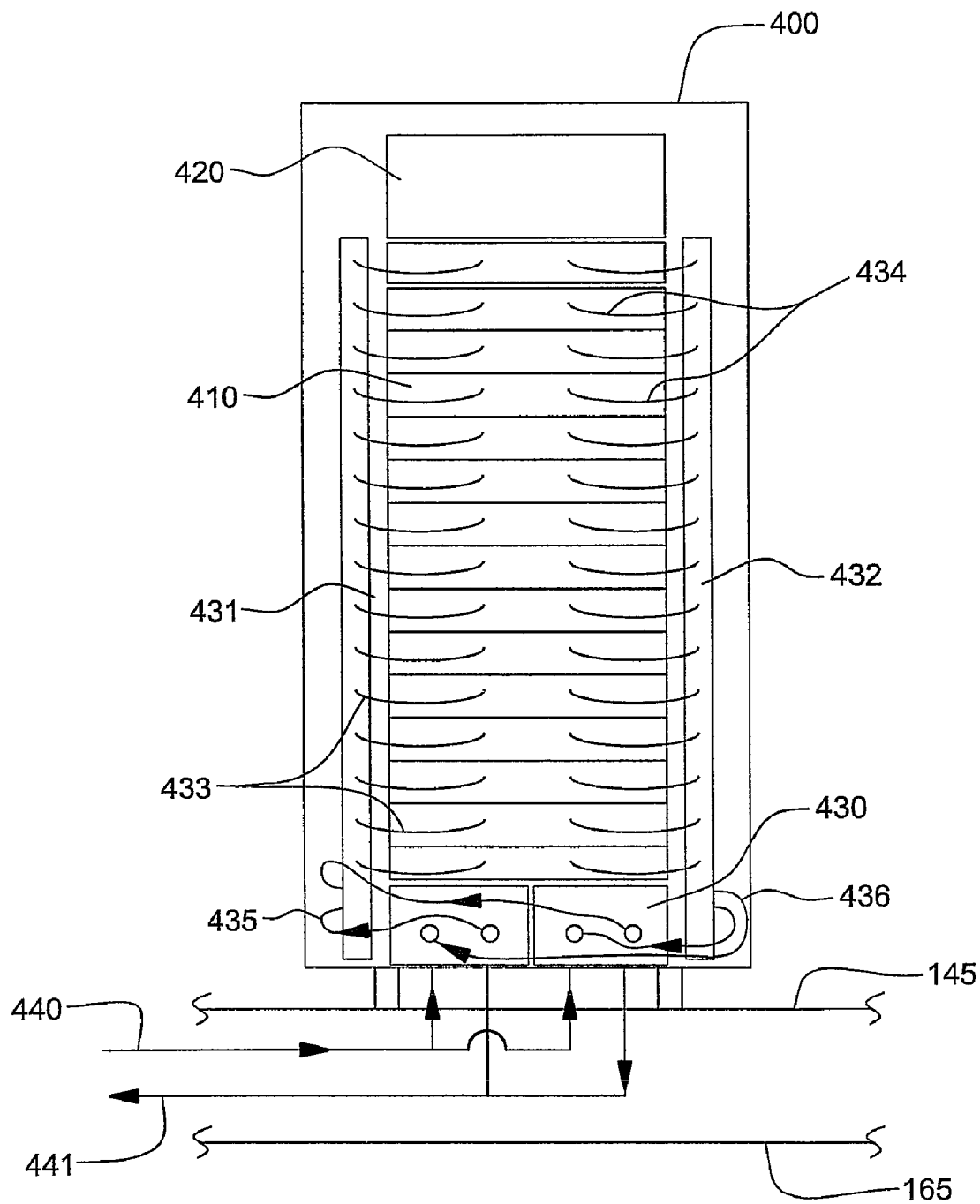
FIG. 4 is a front elevational view of one embodiment of a liquid-cooled electronics rack comprising multiple electronics subsystems cooled by an apparatus, in accordance with an aspect of the present invention.

FIG. 4 depicts one embodiment of a liquid-cooled electronics rack 400 which employs a cooling system to be monitored and operated utilizing the systems and methods described herein. In one embodiment, liquid-cooled electronics rack 400 comprises a plurality of electronics subsystems 410, which are processor or server nodes. A bulk power regulator 420 is shown disposed at an upper portion of liquid-cooled electronics rack 400, and two modular cooling units (MCUs) 430 are disposed in a lower portion of the liquid cooled electronics rack. In the embodiments described herein, the coolant is assumed to be water or an aqueous-based solution, again, by way of example only.

In addition to MCUs 430, the cooling system includes a system water supply manifold 431, a system water return manifold 432, and manifold-to-node fluid connect hoses 433 coupling system water supply manifold 431 to electronics subsystems 410, and node-to-manifold fluid connect hoses 434 coupling the individual electronics subsystems 410 to system water return manifold 432. Each MCU 430 is in fluid communication with system water supply manifold 431 via a respective system water supply hose 435, and each MWCU 430 is in fluid communication with system water return manifold 432 via a respective system water return hose 436.

As illustrated, heat load of the electronics subsystems is transferred from the system water to cooler facility water supplied by facility water supply line 440 and facility water return line 441 disposed, in the illustrated embodiment, in the space between a raised floor 145 and a base floor 165.

Figure 5:
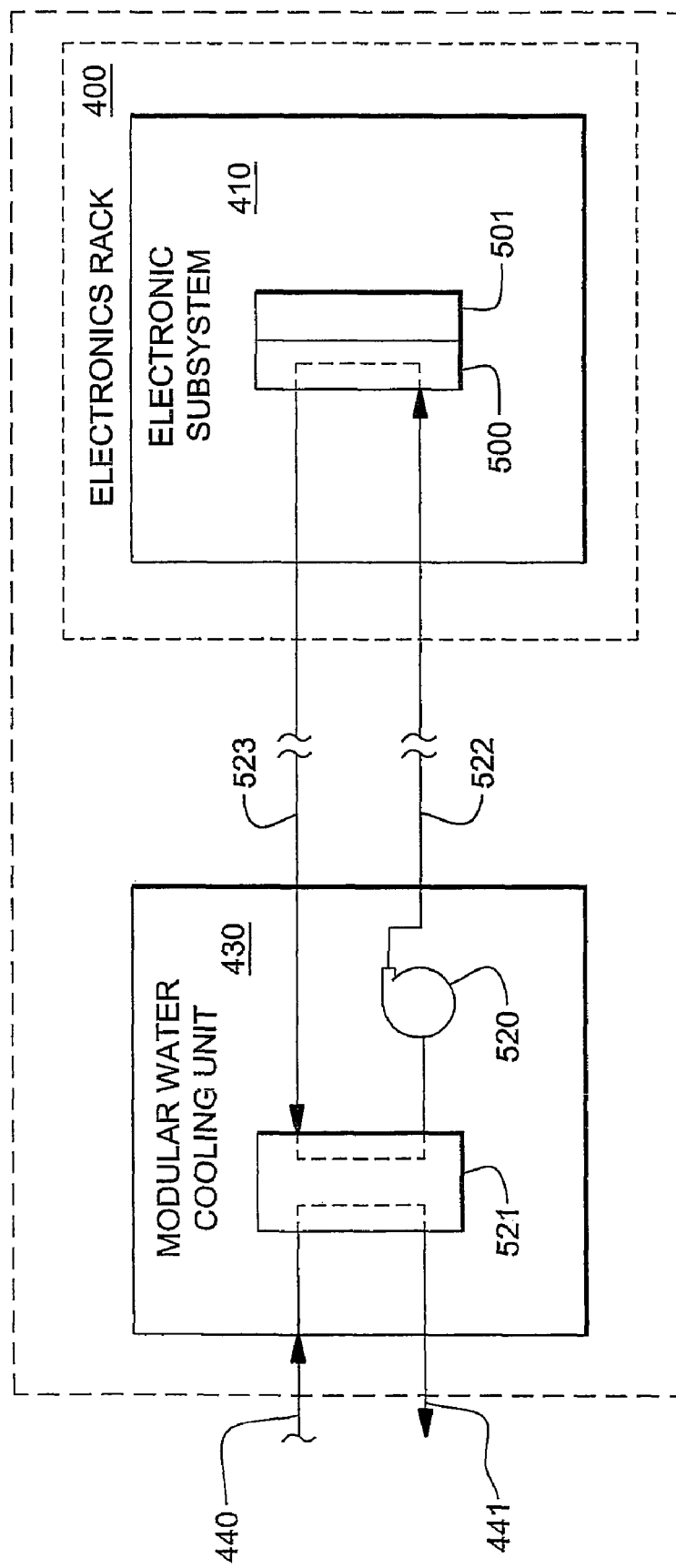
FIG. 5 is a schematic of one embodiment of an electronics subsystem of an electronics rack, wherein an electronics module is liquid-cooled by system coolant provided by one or more modular cooling units disposed within the electronics rack, in accordance with an aspect of the present invention.

FIG. 5 schematically illustrates operation of the cooling system of FIG. 4, wherein a liquid-cooled cold plate 500 is shown coupled to an electronics module 501 of an electronics subsystem 410 within the liquid-cooled electronics rack 400. Heat is removed from electronics module 501 via the system coolant circulated via pump 520 through cold plate 500 within the system coolant loop defined by liquid-to-liquid heat exchanger 521 of modular water cooling unit 430, lines 522, 523 and cold plate 500. The system coolant loop and modular water cooling unit are designed to provide coolant of a controlled temperature and pressure, as well as controlled chemistry and cleanliness to the electronics module(s). Furthermore, the system coolant is physically separate from the less controlled facility coolant in lines 440, 441, to which heat is ultimately transferred.

Figure 6:
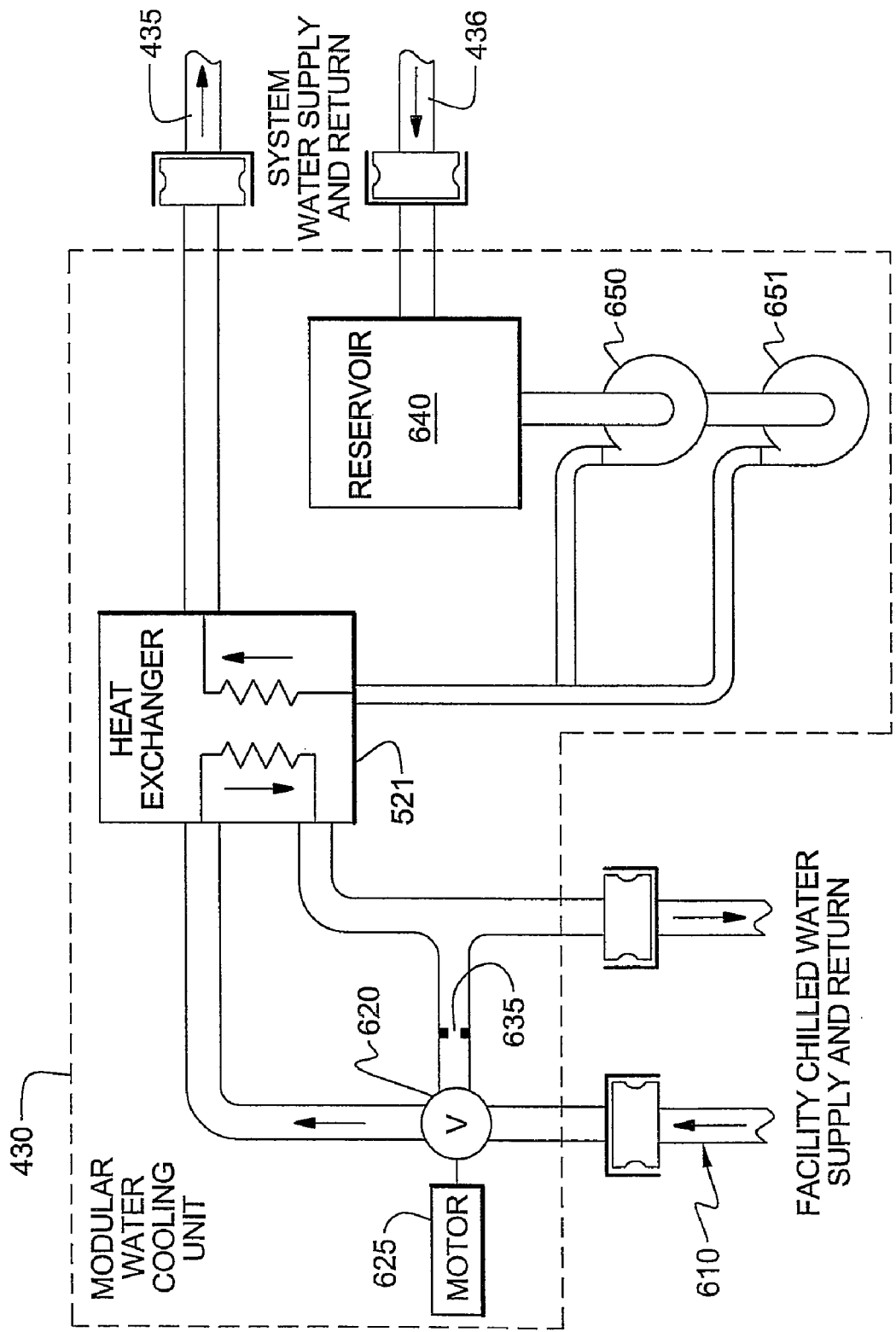
FIG. 6 is a schematic of one embodiment of a modular cooling unit disposed within a liquid-cooled electronics rack, in accordance with an aspect of the present invention.

FIG. 6 depicts a more detailed embodiment of a modular water cooling unit 430, in accordance with an aspect of the present invention. As shown in FIG. 6, modular water cooling unit 430 includes a first cooling loop wherein building chilled, facility coolant is supplied 610 and passes through a control valve 620 driven by a motor 625. Valve 620 determines an amount of facility coolant to be passed through heat exchanger 521, with a portion of the facility coolant possibly being returned directly via a bypass orifice 635. The modular water cooling unit further includes a second cooling loop with a reservoir tank 640 from which system coolant is pumped, either by pump 650 or pump 651, into the heat exchanger 521 for conditioning and output thereof, as cooled system coolant to the electronics rack to be cooled. The cooled system coolant is supplied to the system water supply manifold and system water return manifold of the liquid-cooled electronics rack via the system water supply hose 435 and system water return hose 436.

Figure 7:
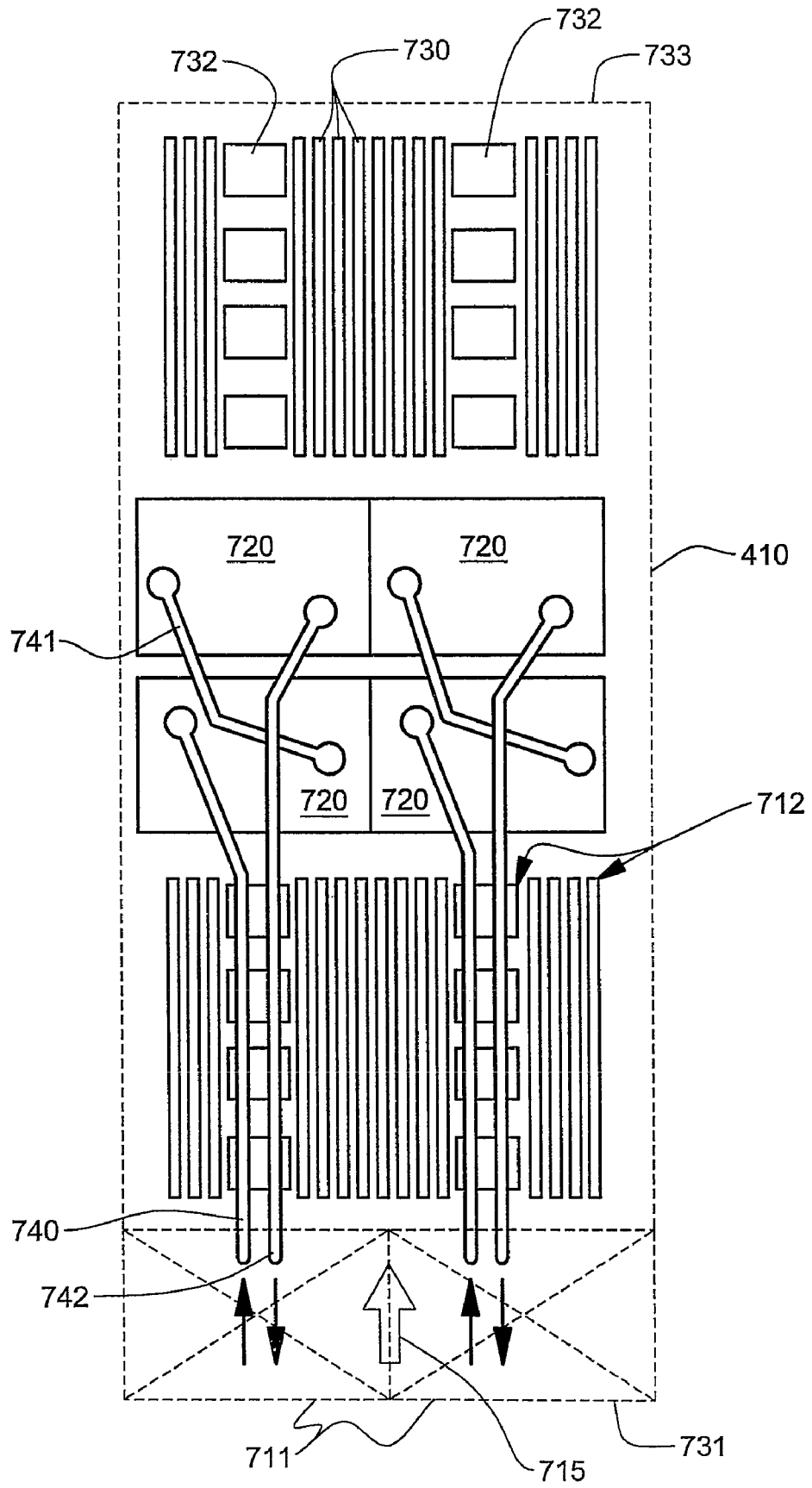
FIG. 7 is a plan view of one embodiment of an electronics subsystem layout illustrating an air and liquid cooling subsystem for cooling components of the electronics subsystem, in accordance with an aspect of the present invention.

FIG. 7 depicts one embodiment of an electronics subsystem 410 component layout wherein one or more air moving devices 711 provide forced air flow 715 to cool multiple components 712 within electronics subsystem 713. Cool air is taken in through a front 731 and exhausted out a back 733 of the drawer. The multiple components to be cooled include multiple processor modules to which liquid-cooled cold plates 720 (of a liquid-based cooling system) are coupled, as well as multiple arrays of memory modules 730 (e.g., dual in-line memory modules (DIMMs)) and multiple rows of memory support modules 732 (e.g., DIMM control modules) to which air-cooled heat sinks are coupled. In the embodiment illustrated, memory modules 730 and the memory support modules 732 are partially arrayed near front 731 of electronics subsystem 410, and partially arrayed near back 733 of electronics subsystem 410. Also, in the embodiment of FIG. 7, memory modules 730 and the memory support modules 732 are cooled by air flow 715 across the electronics subsystem.

The illustrated liquid-based cooling system further includes multiple coolant carrying tubes connected to and in fluid communication with liquid-cooled cold plates 720. The coolant-carrying tubes comprise sets of coolant-carrying tubes, with each set including (for example) a coolant supply tube 740, a bridge tube 741 and a coolant return tube 742. In this example, each set of tubes provides liquid coolant to a series-connected pair of cold plates 720 (coupled to a pair of processor modules). Coolant flows into a first cold plate of each pair via the coolant supply tube 740 and from the first cold plate to a second cold plate of the pair via bridge tube or line 741, which may or may not be thermally conductive. From the second cold plate of the pair, coolant is returned through the respective coolant return tube 742.

Figure 8:
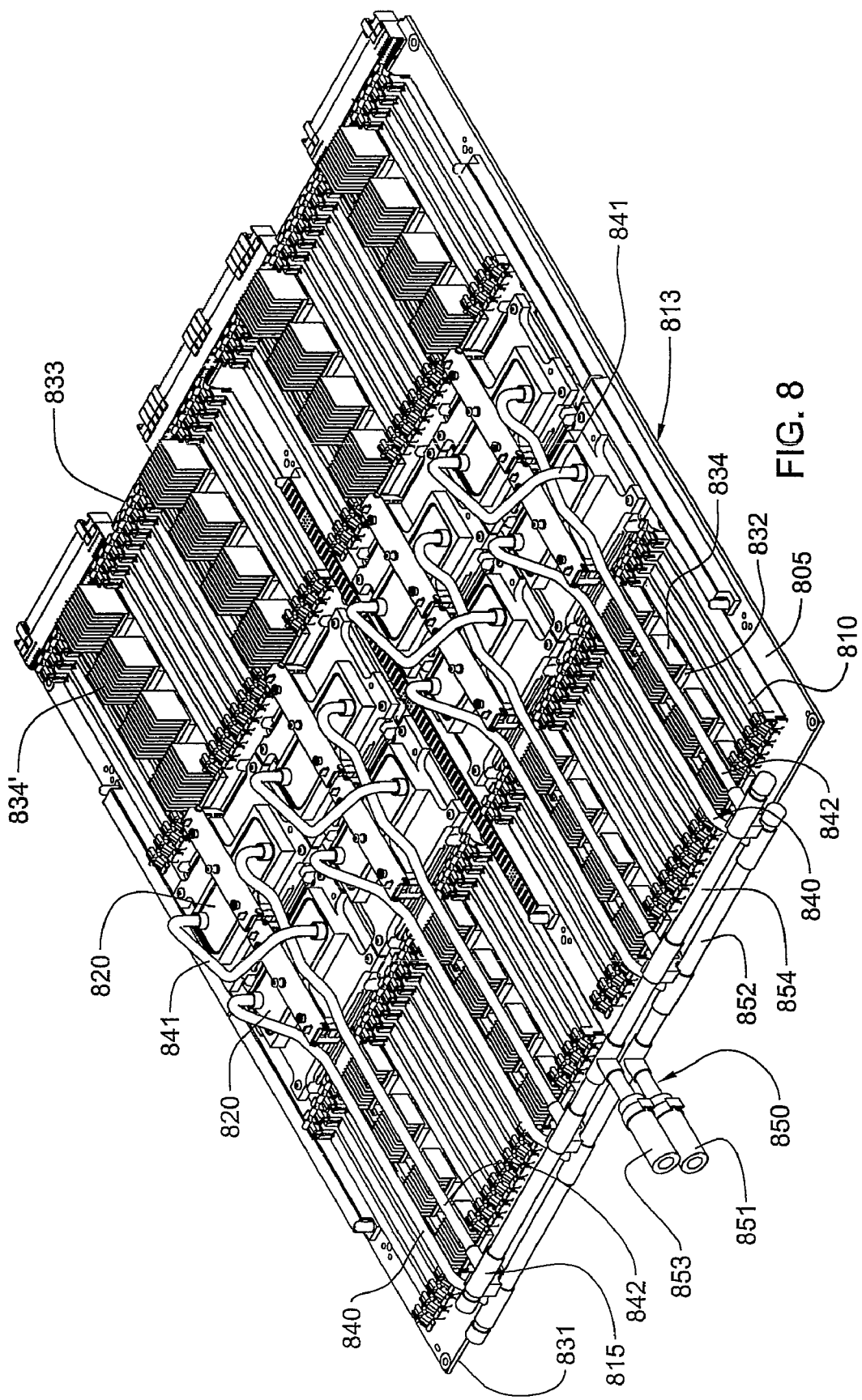
FIG. 8 depicts one detailed embodiment of a partially assembled electronics subsystem layout, wherein the electronics subsystem includes eight heat-generating electronics components to be actively cooled, each having a respective liquid-cooled cold plate of a liquid-based cooling system coupled thereto, in accordance with an aspect of the present invention.

FIG. 8 depicts in greater detail an alternate electronics drawer layout comprising eight processor modules, each having a respective liquid-cooled cold plate of a liquid-based cooling system coupled thereto. The liquid-based cooling system is shown to further include associated coolant-carrying tubes for facilitating passage of liquid coolant through the liquid-cooled cold plates and a header subassembly to facilitate distribution of liquid coolant to and return of liquid coolant from the liquid-cooled cold plates. By way of specific example, the liquid coolant passing through the liquid-based cooling subsystem is chilled water.

As noted, various liquid coolants significantly outperform air in the task of removing heat from heat-generating electronic components of an electronics system, and thereby more effectively maintain the components at a desirable temperature for enhanced reliability and peak performance. As liquid-based cooling systems are designed and deployed, it is advantageous to architect systems which maximize reliability and minimize the potential for leaks while meeting all other mechanical, electrical and chemical requirements of a given electronics system implementation. These more robust cooling systems have unique problems in their assembly and implementation. For example, one assembly solution is to utilize multiple fittings within the electronics system, and use flexible plastic or rubber tubing to connect headers, cold plates, pumps and other components. However, such a solution may not meet a given customer's specifications and need for reliability.

Thus, presented herein in one aspect is a robust and reliable liquid-based cooling system specially preconfigured and prefabricated as a monolithic structure for positioning within a particular electronics drawer.

FIG. 8 is an isometric view of one embodiment of an electronics drawer and monolithic cooling system, in accordance with an aspect of the present invention. The depicted planar server assembly includes a multi-layer printed circuit board to which memory DIMM sockets and various electronic components to be cooled are attached both physically and electrically. In the cooling system depicted, a supply header is provided to distribute liquid coolant from a single inlet to multiple parallel coolant flow paths and a return header collects exhausted coolant from the multiple parallel coolant flow paths into a single outlet. Each parallel coolant flow path includes one or more cold plates in series flow arrangement to cool one or more electronic components to which the cold plates are mechanically and thermally coupled. The number of parallel paths and the number of series-connected liquid-cooled cold plates depends, for example on the desired device temperature, available coolant temperature and coolant flow rate, and the total heat load being dissipated from each electronic component.

More particularly, FIG. 8 depicts a partially assembled electronics system 813 and an assembled liquid-based cooling system 815 coupled to primary heat-generating components (e.g., including processor dies) to be cooled. In this embodiment, the electronics system is configured for (or as) an electronics drawer of an electronics rack, and includes, by way of example, a support substrate or planar board 805, a plurality of memory module sockets 810 (with the memory modules (e.g., dual in-line memory modules) not shown), multiple rows of memory support modules 832 (each having coupled thereto an air-cooled heat sink 834), and multiple processor modules (not shown) disposed below the liquid-cooled cold plates 820 of the liquid-based cooling system 815.

In addition to liquid-cooled cold plates 820, liquid-based cooling system 815 includes multiple coolant-carrying tubes, including coolant supply tubes 840 and coolant return tubes 842 in fluid communication with respective liquid-cooled cold plates 820. The coolant-carrying tubes 840, 842 are also connected to a header (or manifold) subassembly 850 which facilitates distribution of liquid coolant to the coolant supply tubes and return of liquid coolant from the coolant return tubes 842. In this embodiment, the air-cooled heat sinks 834 coupled to memory support modules 832 closer to front 831 of electronics drawer 813 are shorter in height than the air-cooled heat sinks 834' coupled to memory support modules 832 near back 833 of electronics drawer 813. This size difference is to accommodate the coolant-carrying tubes 840, 842 since, in this embodiment, the header subassembly 850 is at the front 831 of the electronics drawer and the multiple liquid-cooled cold plates 820 are in the middle of the drawer.

Liquid-based cooling system 815 comprises a preconfigured monolithic structure which includes multiple (pre-assembled) liquid-cooled cold plates 820 configured and disposed in spaced relation to engage respective heat-generating electronic components. Each liquid-cooled cold plate 820 includes, in this embodiment, a liquid coolant inlet and a liquid coolant outlet, as well as an attachment subassembly (i.e., a cold plate/load arm assembly). Each attachment subassembly is employed to couple its respective liquid-cooled cold plate 820 to the associated electronic component to form the cold plate and electronic component assemblies. Alignment openings (i.e., thru-holes) are provided on the sides of the cold plate to receive alignment pins or positioning dowels during the assembly process. Additionally, connectors (or guide pins) are included within attachment subassembly which facilitates use of the attachment assembly.

As shown in FIG. 8, header subassembly 850 includes two liquid manifolds, i.e., a coolant supply header 852 and a coolant return header 854, which in one embodiment, are coupled together via supporting brackets. In the monolithic cooling structure of FIG. 8, the coolant supply header 852 is metallurgically bonded and in fluid communication to each coolant supply tube 840, while the coolant return header 854 is metallurgically bonded and in fluid communication to each coolant return tube 852. A single coolant inlet 851 and a single coolant outlet 853 extend from the header subassembly for coupling to the electronics rack's coolant supply and return manifolds (not shown).

FIG. 8 also depicts one embodiment of the preconfigured, coolant-carrying tubes. In addition to coolant supply tubes 840 and coolant return tubes 842, bridge tubes or lines 841 are provided for coupling, for example, a liquid coolant outlet of one liquid-cooled cold plate to the liquid coolant inlet of another liquid-cooled cold plate to connect in series fluid flow the cold plates, with the pair of cold plates receiving and returning liquid coolant via a respective set of coolant supply and return tubes. In one embodiment, the coolant supply tubes 840, bridge tubes 841 and coolant return tubes 842 are each preconfigured, semi-rigid tubes formed of a thermally conductive material, such as copper or aluminum, and the tubes are respectively brazed, soldered or welded in a fluid-tight manner to the header subassembly and/or the liquid-cooled cold plates. The tubes are preconfigured for a particular electronics system to facilitate installation of the monolithic structure in engaging relation with the electronics system.

Liquid cooling of heat-generating electronics components within an electronics rack can greatly facilitate removal of heat generated by those components. However, in certain high performance systems, the heat dissipated by certain components being liquid-cooled, such as processors, may exceed the ability of the liquid cooling system to extract heat. For example, a fully configured liquid-cooled electronics rack, such as described hereinabove may dissipate approximately 72 kW of heat. Half of this heat may be removed by liquid coolant using liquid-cooled cold plates such as described above. The other half of the heat may be dissipated by memory, power supplies, etc., which are air-cooled. Given the density at which electronics racks are placed on a data center floor, existing air-conditioning facilities are stressed with such a high air heat load from the electronics rack. Thus, a solution presented herein is to incorporate an air-to-liquid heat exchanger, for example, at the air outlet side of the electronics rack, to extract heat from air egressing from the electronics rack. The air-to-liquid heat exchanger eliminates the need for costly outside-of-rack conditioned air units for cooling the electronics rack and the computer room's ambient air. By cooling the exhaust air that egresses the electronics rack exclusive of outside-of-rack conditioned air units, the air-to-liquid heat exchanger also obviates the need for costly air-containment systems. This solution is presented herein in combination with liquid-cooled cold plate cooling of certain primary heat-generating components within the electronics rack. To provide the necessary amount of coolant, two MCUs are associated with the electronics rack, and system coolant is fed from each MCU to the air-to-liquid heat exchanger in parallel to the flow of system coolant to the liquid-cooled cold plates disposed within the one or more electronics subsystems of the electronics rack. Note that if desired, flow of system coolant to the individual liquid cooled cold plates may be in any one of a multitude of series/parallel arrangements.

Also, for a high availability system, techniques are described herein below for maintaining operation of one modular cooling unit, notwithstanding failure of another modular cooling unit of an electronics rack. This allows continued provision of system coolant to the one or more electronics subsystems of the rack being liquid-cooled. To facilitate liquid cooling of the primary heat-generating electronics components within the electronics rack, one or more isolation valves are employed (upon detection of failure at one MCU of the two MCUs) to shut off coolant flow to the air-to-liquid heat exchanger, and thereby, conserve coolant for the direct cooling of the electronics subsystems.

The above-summarized aspects of the invention are described further below with reference to the system and method embodiment of FIGS. 9-13.

Figure 9:
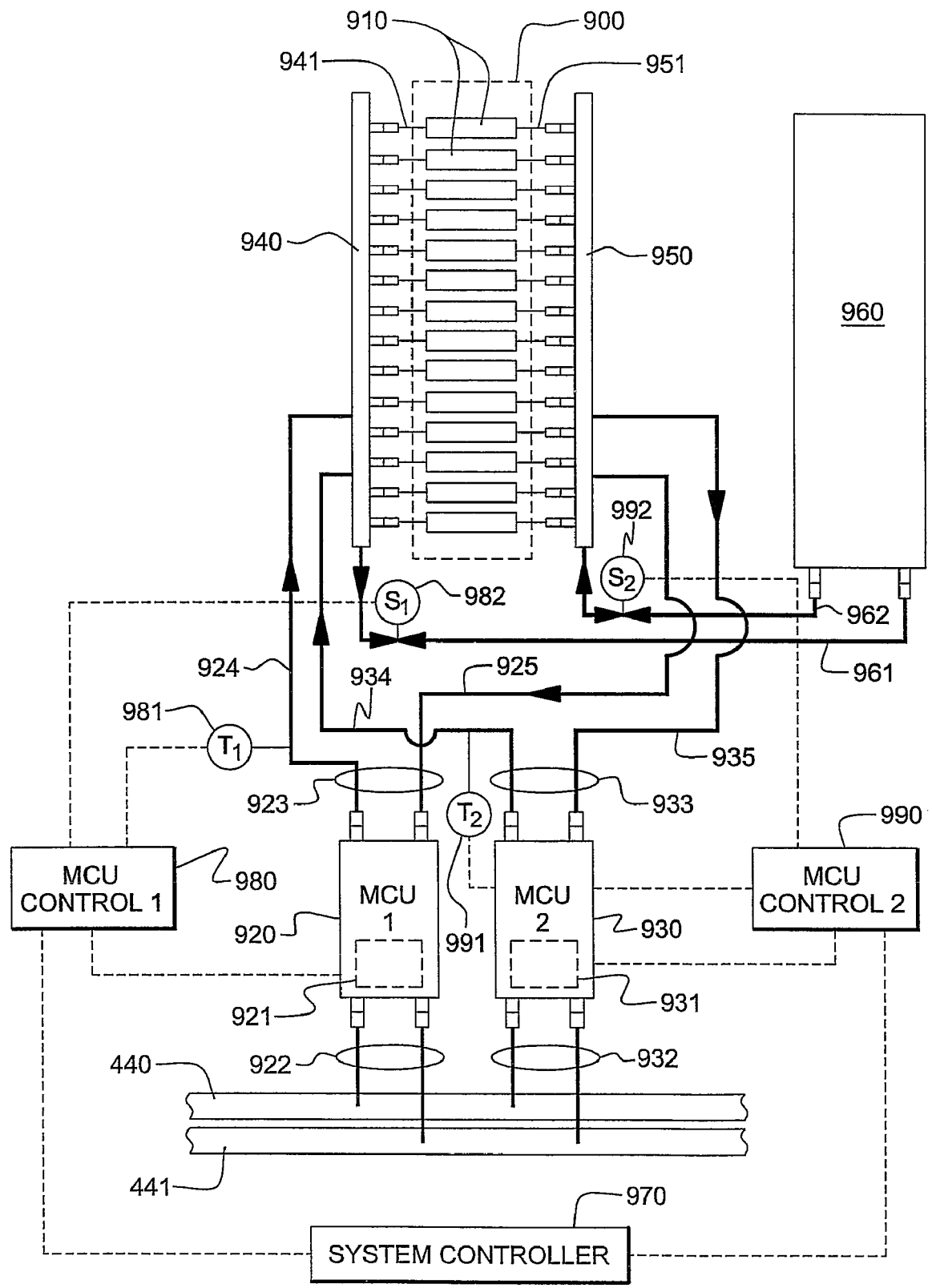
FIG. 9 is a schematic of one embodiment of a system comprising a liquid-cooled electronics rack and a cooling system associated therewith, wherein the cooling system includes two modular cooling units (MCUs) for providing in parallel liquid coolant to the electronics subsystems of the rack, and to an air-to-liquid heat exchanger disposed, for example, at an air outlet side of the electronics rack for cooling air egressing there from, in accordance with an aspect of the present invention.

FIG. 9 illustrates one embodiment of a system wherein an electronics rack 900 includes a plurality of heat-generating electronic subsystems 910, which are liquid-cooled employing a cooling system comprising at least two modular cooling units (MCUs) 920, 930 labeled MCU 1 & MCU 2, respectively. The MCUs are configured and coupled to provide system coolant in parallel to the plurality of heat-generating electronic subsystems for facilitating liquid cooling thereof. Each MCU 920, 930 includes a liquid-to-liquid heat exchanger 921, 931, a first coolant loop 922, 932, and a second coolant loop, 923, 933, respectively. The first coolant loops 922, 932 are coupled to receive chilled coolant, such as facility coolant, via (for example) facility water supply line 440 and facility water return line 441. Each first coolant loop 922, 932 passes at least a portion of the chilled coolant flowing therein through the respective liquid-to-liquid heat exchanger 921, 931. Each second coolant loop 923, 933 provides cooled system coolant to the plurality of heat-generating electronic subsystems 910 of electronics rack 900, and expels heat via the respective liquid-to-liquid heat exchanger 921, 931 from the plurality of heat-generating electronic subsystems 910 to the chilled coolant in the first coolant loop 922, 932.

The second coolant loops 923, 933 include respective coolant supply lines 924, 934, which supply cooled system coolant from the liquid-to-liquid heat exchangers 921, 931 to a system coolant supply manifold 940. System coolant supply manifold 940 is coupled via flexible supply hoses 941 to the plurality of heat-generating electronics subsystems 910 of electronics rack 900 (e.g., using quick connect couplings connected to respective ports of the system coolant supply manifold). Similarly, second coolant loops 923, 933 include system coolant return lines 925, 935 coupling a system coolant return manifold 950 to the respective liquid-to-liquid heat exchangers 921, 931. System coolant is exhausted from the plurality of heat-generating electronics components 910 via flexible return hoses 951 coupling the heat-generating electronics subsystems to system coolant return manifold 950. In one embodiment, the return hoses may couple to respective ports of the system coolant return manifold via quick connect couplings. Further, in one embodiment, the plurality of heat-generating electronics subsystems each include a respective liquid-based cooling subsystem, such as described above in connection with FIGS. 7 & 8, coupled to flexible supply hoses 941 and flexible return hoses 951 to facilitate liquid cooling of one or more heat-generating electronics components disposed within the electronics subsystem.

In addition to supplying and exhausting system coolant in parallel to the plurality of heat-generating electronics subsystems of the electronics rack, the MCUs 920, 930 also provide in parallel system coolant to an air-to-liquid heat exchanger 960 disposed, for example, for cooling air passing through the electronics rack from an air inlet side to an air outlet side thereof. By way of example, air-to-liquid heat exchanger 960 is a rear door heat exchanger disposed at the air outlet side of electronics rack 900. Further, in one example, air-to-liquid heat exchanger 960 is sized to cool substantially all air egressing from electronics rack 900, and thereby eliminate external air-conditioning requirements for a data center containing the electronics rack. In one example, a plurality of electronics racks in the data center are each provided with a cooling system such as described herein and depicted in FIG. 9.

In the embodiment of FIG. 9, system coolant flows to and from air-to-liquid heat exchanger 960 via a coolant supply line 961 coupling system coolant supply manifold 940 to air-to-liquid heat exchanger 960, and a coolant return line 962 coupling the air-to-liquid heat exchanger to system coolant return manifold 950. Quick connect couplings may be employed at the inlet and outlet of air-to-liquid heat exchanger 960 and/or at corresponding ports at the system coolant supply and return manifolds to facilitate connection of coolant supply and return lines 961, 962. In one embodiment, it is assumed that one MCU of the two MCUs illustrated is incapable of being sized to function within required design parameters as a primary MCU (with the other MCU being a backup MCU) to extract the full heat load from both the plurality of heat-generating electronics subsystems and the air-to-liquid heat exchanger. Therefore, the two MCUs 920, 930 are assumed in normal operation to be functioning in parallel. This also ensures a measure of redundancy to the cooling system.

As shown, the cooling system further includes a system controller 970, and an MCU control 1 980 and an MCU control 2 990, which cooperate together to monitor system coolant temperature of each MCU, and automatically isolate air-to-liquid heat exchanger 960 upon detection of failure of one MCU (as well as to ensure shut down of a failing MCU) so as not to degrade cooling capability of the system coolant provided by the remaining operational MCU to the electronics subsystems of the rack. In one embodiment, the MCU control 1 and the MCU control 2 are control cards, each associated with a respective MCU.

As shown, system controller 970 is coupled to both MCU control 1 and the MCU control 2. MCU control 1 980 is coupled to a temperature sensor $T_1$ 981, which is disposed to sense system coolant temperature within system coolant supply line 924, for example, near a coolant outlet of liquid-to-liquid heat exchanger 921 within MCU 1 920. Additionally, MCU control 1 980 is coupled to a solenoid-actuated isolation valve 982, which in the embodiment depicted, is disposed within coolant supply line 961 coupling system coolant supply manifold 940 to air-to-liquid heat exchanger 960. Similarly, MCU control 2 990 couples to MCU 2 930, as well as to a second temperature sensor $T_2$ 991, disposed for sensing system coolant temperature within system coolant supply line 934, and to a second isolation valve $S_2$ 992, which in the example depicted, is coupled to coolant return line 962 coupling air-to-liquid heat exchanger 960 to coolant supply return manifold 950.

FIGS. 10-13 are flowcharts which illustrate processing implemented by system controller 970, MCU control 1 980 and MCU control 2 990. Table 1 describes variables used in the example flowcharts of FIGS. 10-13, as well as possible values and initial conditions for each variable when the cooling system is operating normally.

TABLE 1

| Variable | Description | Value = 1 | Value = 0 | Initial Condition |
|---|---|---|---|---|
| TS | Temperature within specification? | In specification | Out of specification | 1 |
| ST | MCU ON or OFF? | ON | OFF | 1 |
| SV | Isolation valve open or closed? | Open | Closed | 1 |
| FS | Has MCU been shut down? | Has been shut down | Has not been shut down | 0 |
| FV | Has isolation valve been closed? | Has been closed | Has not been closed | 0 |

The variables are further qualified in FIGS. 10-13 with the number "1" or the number "2", representative of whether the variable applies to the first or second temperature sensor, first or second MCU, or first or second isolation valve.

In the below discussion, although described with reference to processing within system controller 970 (FIG. 9) and MCU control 1 card 980 and MCU control 2 card 990, one skilled in the art will understand that the processing described herein could readily be implemented by a single controller coupled to each temperature sensor, isolation valve and MCU. In the illustrated embodiment, FIGS. 10 & 12 depict processing implemented within system controller 970, while FIG. 11 describes processing of MCU control 1 980 and FIG. 13 processing of MCU control 2 990 (by way of example only).

Figure 10:
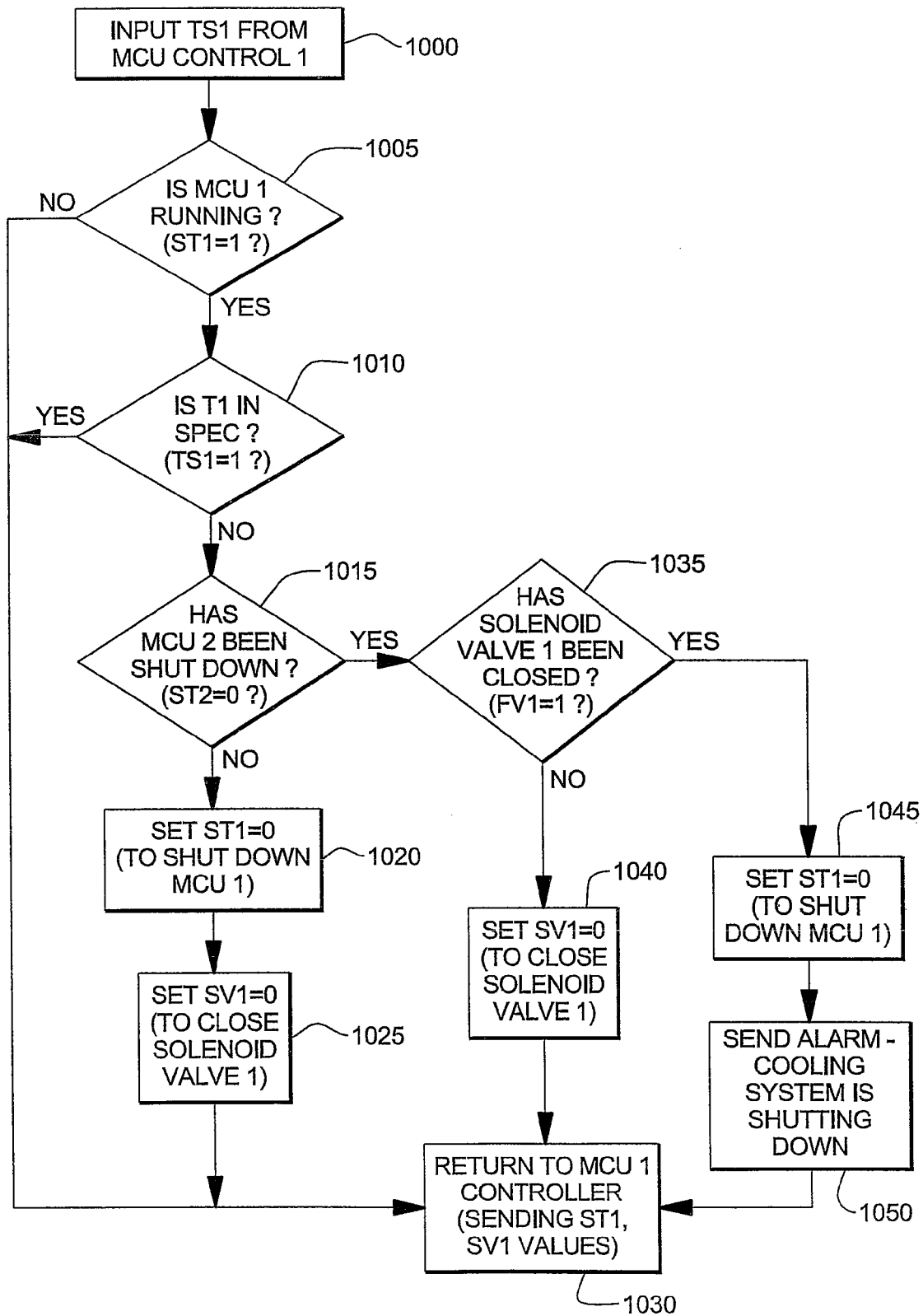
FIG. 10 is a flowchart of one embodiment of processing implemented by the system controller of FIG. 9 for facilitating detection of a failure at MCU 1, and responsive thereto, shutting off of MCU 1 and shutting off flow of coolant to the air-to-liquid heat exchanger, in accordance with an aspect of the present invention.

Beginning with FIG. 10, the system controller receives as input variable TS 1 from MCU control 1 1000, which indicates whether system coolant being output from MCU 1 is within specification (i.e., within a defined range). The system controller initially determines whether MCU 1 is running (that is, whether the variable ST1=1) 1005. If "no", then processing returns to MCU control 1 1030 with the system controller sending current ST1 and SV 1 values back to MCU control 1.

Assuming that MCU 1 is running, then the system controller determines whether the temperature sensed at temperature sensor T1 is within specification (i.e., whether TS 1=1) 1010. If "yes", processing returns to MCU control 1 1030. Assuming that system coolant temperature sensed by temperature sensor T1 is out of specification, then the system controller determines whether MCU 2 has been shut down (i.e., ST2=0?) 1015. If "no", then the variable ST1 is set to zero to indicate that MCU 1 should be shut down 1020, and the variable SV1 is set to zero to direct closing of isolation valve $S_1$ 1025. These new values are returned to MCU control 1 1030, which acts on the new values as described herein below.

Assuming that MCU 2 has been shut down, then processing inquires whether isolation valve $S_1$ has been closed (FV1=1?) 1035. If "no", then the variable SV1 is set to zero to instruct closing of isolation valve $S_1$ 1040, after which processing returns to MCU control 1 with the new SV1 value to effectuate closing of isolation valve $S_1$. If isolation valve $S_1$ has been closed, then the system controller sets the variable ST1 equal to zero to shut down MCU 1 1045 and issues an alarm (e.g., to a data center operator) indicating that the cooling system for the associated electronics rack is shutting down 1050, after which processing returns to MCU control 1 to effectuate the MCU 1 shut down.

Figure 11:
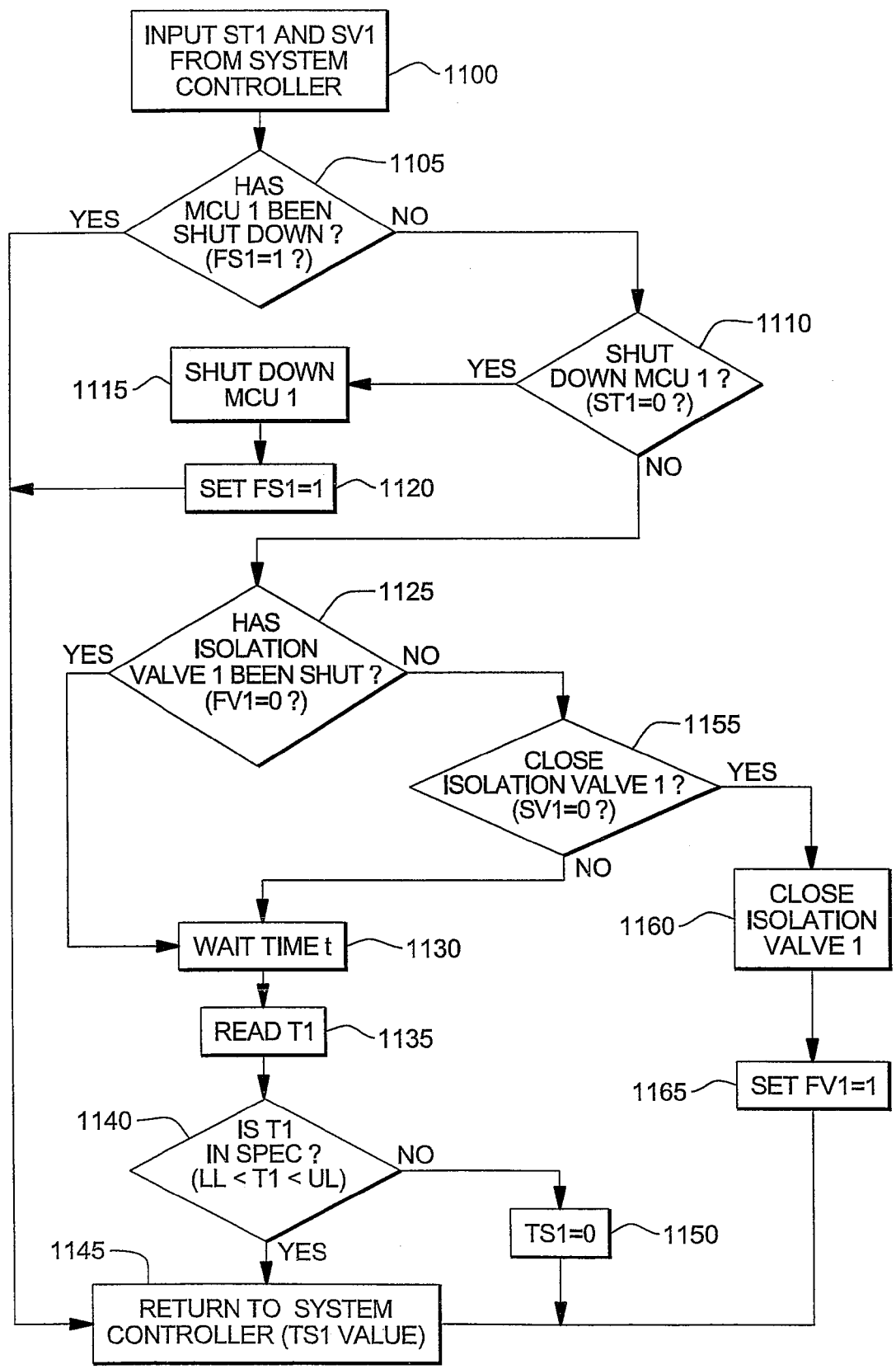
FIG. 11 is a flowchart of one embodiment of processing implemented by the MCU control 1 of FIG. 9, which facilitates monitoring of system coolant temperature, shut down of MCU 1 upon detection of a failure thereof, and shut off of isolation valve 1, in accordance with an aspect of the present invention.
Figure 12:
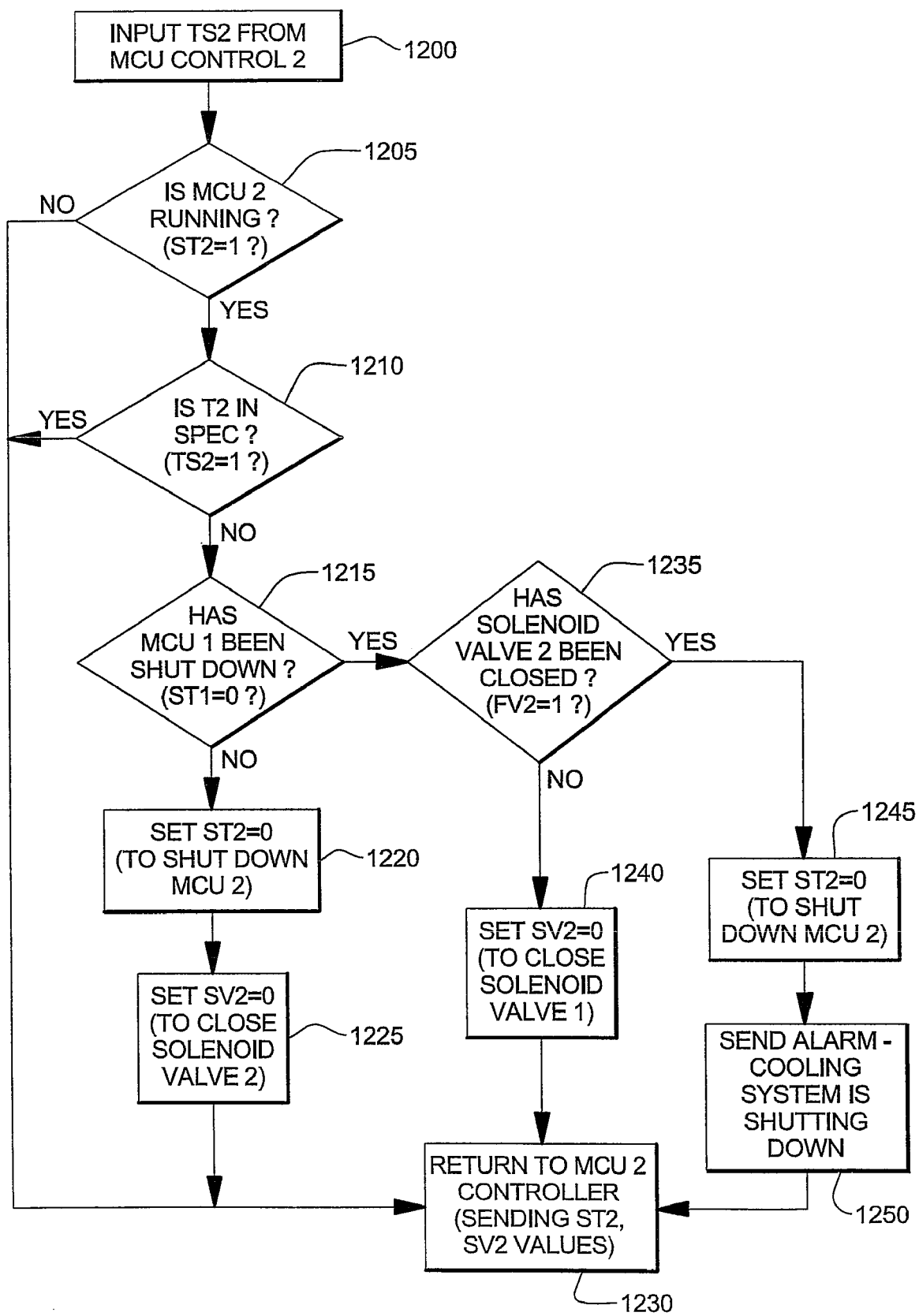
FIG. 12 is a flowchart of one embodiment of processing implemented by the system controller of FIG. 9 for facilitating detection of a failure at MCU 2, and responsive thereto, shutting off of MCU 2 and shutting off flow of coolant through the air-to-liquid heat exchanger, in accordance with an aspect of the present invention.

As noted, FIG. 11 depicts one embodiment of processing implemented by MCU control 1 980 (FIG. 9). MCU control 1 receives as input the variables ST1 and SV1 from the system controller 1100, and initially determines whether MCU 1 has been shut down (FS1=1?) 1105. If "yes", then processing returns to the system controller 1145. If "no", then processing determines whether MCU 1 is to be shut down (ST1=0?) 1110. If "yes", MCU control 1 shuts down MCU 1 1115 and sets the variable FS1 equal to 1 1120, indicating that MCU 1 has been shut down, after which processing returns to the system controller 1145.

Assuming that MCU 1 is not to be shut down, then processing determines whether isolation valve $S_1$ has been shut (FV 1=0?) 1125. If "yes", processing waits time t 1130 before reading temperature sensor T1 1135. By way of example, time t might be 15-30 seconds in operation. Processing then determines whether the value of temperature sensor Ti is within specification (e.g., is T greater than a predefined acceptable lower limit (LL), and less than a predefined acceptable upper limit (UL)?) 1140. If "no", then the variable TS 1 is set to zero to indicate that system coolant temperature is out of specification 1150 and processing returns to system controller 1145. From inquiry 1125, if isolation valve $S_1$ has not been shut, processing determines whether isolation valve $S_1$ is to be closed 1155. If "no", processing waits time t, and then proceeds as described above. Otherwise, MCU control 1 closes isolation valve $S_1$ 1160 and sets the variable FV 1 equal to 1 1165, and returns processing control to system controller 1145.

As noted, FIG. 12 depicts system controller processing with respect to MCU control 2. As described above in connection with FIG. 10, the system controller receives as input variable TS2 from MCU control 2 1200, which indicates whether second system coolant temperature is within specification (i.e., within a defined range). The system controller initially determines whether MCU 2 is running (ST2=1?) 1205. If "no", then processing returns to MCU control 2 1230, with the system controller sending current ST2 and SV2 values back to MCU control 2.

Assuming that MCU 2 is running, then the system controller determines whether the temperature sensed at temperature sensor T2 is within specification (TS2=1) 1210. If "yes", processing returns to MCU control 2 1230. Assuming that system coolant temperature sensed by temperature sensor T2 is out of specification, then the system controller determines whether MCU 2 has been shut down (ST2=0?) 1215. If "no", then the variable ST2 is set to zero to indicate that MCU 2 should be shut down 1220, and the variable SV2 is set to zero to direct closing of isolation valve $S_2$ 1225. These new values are returned to MCU control 2 1230, which acts on the new values as described below.

Assuming that MCU 2 has been shut down, then processing inquires whether isolation valve $S_2$ has been closed (FV2=1?) 1235. If "no", then the variable SV2 is set to zero to instruct closing of isolation valve $S_2$ 1240, after which processing returns to MCU control 2 with the new SV 2 value to effectuate closing of isolation valve $S_2$. If isolation valve $S_2$ has been closed, then the system controller sets the variable ST2 equal to zero to shut down MCU 2 1245 and issues an alarm (e.g., to a data center operator), indicating that the cooling system for the associated electronics rack is shutting down 1250, after which processing returns to MCU control 2 to effectuate the MCU 2 shut down.

Figure 13:
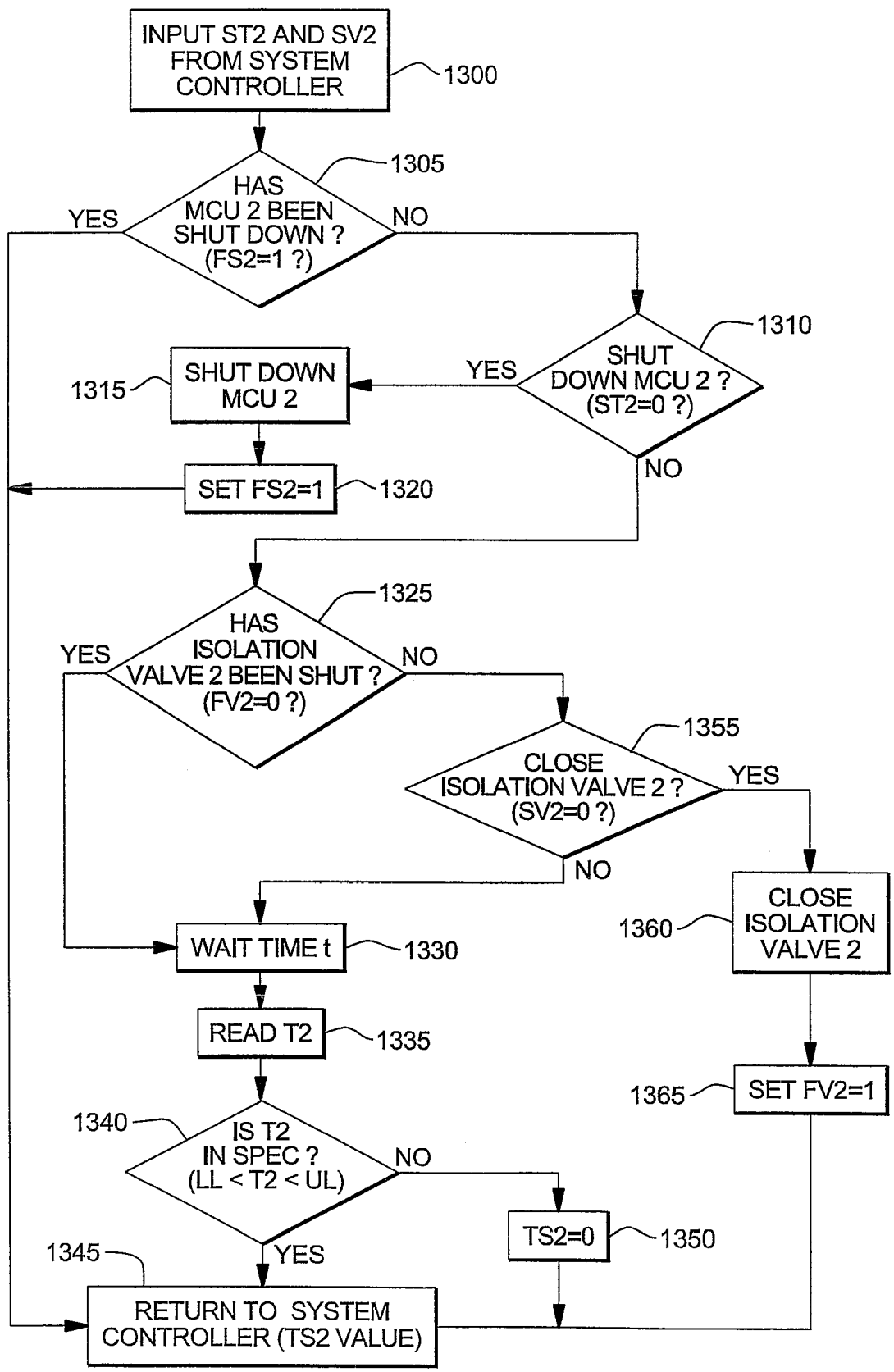
FIG. 13 is a flowchart of one embodiment of processing implemented by the MCU control 2 of FIG. 9, which facilitates monitoring of system coolant temperature, shut down of MCU 2 upon detection of a failure thereof, and shut off of isolation valve 2, in accordance with an aspect of the present invention.

FIG. 13 depicts one embodiment of processing implemented by MCU control 2. MCU control 2 receives as input the variables ST2 and SV2 from the system controller 1300, and initially determines whether MCU 2 has been shut down (i.e., FS 2=1?) 1305. If "yes", then processing returns to the system controller 1345. If "no", then processing determines whether MCU 2 is to be shut down (ST2=0?) 1310. If "yes", MCU control 2 shuts down MCU 2 1315 and sets the variable FS2 equal to 1 1320, indicating that MCU 2 has been shut down, after which processing returns to the system controller 1345.

Assuming that MCU 1 is not to be shut down, then processing determines whether isolation valve $S_2$ has been shut (FV2=0?) 1325. If "yes", processing waits time t 1330 before reading temperature sensor T2 1335. By way of example, time t might be 15-30 seconds in operation. Processing then determines whether the value of temperature sensor T2 is within specification (e.g., is T greater than predefined acceptable lower limit (LL), and less than predefined acceptable upper limit (UL)?) 1340. If "no", then the variable TS2 is set to zero to indicate that system coolant temperature is out of specification 1150 and processing returns to system controller 1345. From inquiry 1325, if isolation valve $S_2$ has not been shut, processing determines whether isolation valve $S_1$ is to be closed 1355. If "no", processing waits time t, and proceeds as described above. Otherwise, MCU control 2 closes isolation valve $S_2$ 1360 and sets the variable FV2 equal to 1 1365 and returns processing control to system controller 1345.

Those skilled in the art will note from the above description that various aspects of the coolant control valve operations and protocol depicted in the figures may be automated by provision of an appropriate controller disposed, for example, within the coolant servicing apparatus, and the use of solenoid-operated control valves coupled to the controller.

More particularly, the detailed description presented above is discussed in terms of procedures which can be executed on a computer, a network or a cluster of computers. These procedural descriptions and representations are used by those skilled in the art to most effectively convey the substance of their work to others skilled in the art. They may be implemented in hardware or software, or a combination of the two.

A procedure is here, and generally, conceived to be a sequence of steps leading to a desired result. These steps are those requiring physical manipulations of physical quantities. Usually, though not necessarily, these quantities take the form of electrical or magnetic signals capable of being stored, transferred, combined, compared, and otherwise manipulated. It proves convenient at times, principally for reasons of common usage, to refer to these signals as bits, values, elements, symbols, characters, terms, numbers, objects, attributes or the like. It should be noted, however, that all of these and similar terms are to be associated with the appropriate physical quantities and are merely convenient labels applied to these quantities.

Further, the manipulations performed are often referred to in terms, such as closing or opening, which are commonly associated with manual operations performed by a human operator. No such intervention of a human operator is necessary in the operations described herein which form part of the present invention; the operations may be implemented as automatic machine operations. Useful machines for performing the operations of the present invention include general purpose digital computers or similar devices.

Aspects of the invention are preferably implemented in a high level procedural or object-oriented programming language to communicate with a computer. However, the inventive aspects can be implemented in assembly or machine language, if desired. In any case, the language may be a compiled or interpreted language.

The invention may be implemented as a mechanism or a computer program product comprising a recording medium. Such a mechanism or computer program product may include, but is not limited to CD-ROMs, diskettes, tapes, hard drives, computer RAM or ROM and/or the electronic, magnetic, optical, biological or other similar embodiment of the program. Indeed, the mechanism or computer program product may include any solid or fluid transmission medium, magnetic or optical, or the like, for storing or transmitting signals readable by a machine for controlling the operation of a general or special purpose programmable computer according to the method of the invention and/or to structure its components in accordance with a system of the invention.

Aspects of the invention may be implemented in a system. A system may comprise a computer that includes a processor and a memory device and optionally, a storage device, an output device such as a video display and/or an input device such as a keyboard or computer mouse. Moreover, a system may comprise an interconnected network of computers. Computers may equally be in stand-alone form (such as the traditional desktop personal computer) or integrated into another environment (such as a partially clustered computing environment). The system may be specially constructed for the required purposes to perform, for example, the method steps of the invention or it may comprise one or more general purpose computers as selectively activated or reconfigured by a computer program in accordance with the teachings herein stored in the computer(s). The procedures presented herein are not inherently related to a particular computing environment. The required structure for a variety of these systems will appear from the description given.

The capabilities of one or more aspects of the present invention can be implemented in software, firmware, hardware or some combination thereof.

One or more aspects of the present invention can be included in an article of manufacture (e.g., one or more computer program products) having, for instance, computer usable media. The media has therein, for instance, computer readable program code means or logic (e.g., instructions, code, commands, etc.) to provide and facilitate the capabilities of the present invention. The article of manufacture can be included as a part of a computer system or sold separately.

Additionally, at least one program storage device readable by a machine embodying at least one program of instructions executable by the machine to perform the capabilities of the present invention can be provided.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A system for facilitating cooling of electronics, the system comprising:
   an electronics rack comprising at least one heat-generating electronics subsystem, the electronics rack comprising an air inlet side and an air outlet side for respectively enabling ingress and egress of external air;
   at least two modular cooling units (MCUs) associated with the electronics rack and configured to provide system coolant in parallel to the at least one heat-generating electronics subsystem for facilitating cooling thereof, wherein each MCU of the at least two MCUs comprises a liquid-to-liquid heat exchanger, a first coolant loop and a second coolant loop, and when operational, the first coolant loop of each MCU receives chilled coolant from a source and passes at least a portion thereof through the liquid-to-liquid heat exchanger, and the second coolant loop provides cooled system coolant to the at least one heat-generating electronics subsystem, and expels heat in the liquid-to-liquid heat exchanger from the at least one heat-generating electronics subsystem to the chilled coolant in the first coolant loop;
   an air-to-liquid heat exchanger associated with the electronics rack for exclusively cooling air passing through the electronics rack, the air-to-liquid heat exchanger being coupled to receive system coolant from the at least two MCUs and exhaust system coolant to the at least two MCUs, wherein said air-to-liquid heat exchanger cools air passing through the electronics rack exclusive of outside-of-rack conditioned air units;
   at least one isolation valve coupled to selectively shut off flow of system coolant through the air-to-liquid heat exchanger; and
   at least one controller coupled to the at least one isolation valve for automatically shutting off flow of system coolant through the air-to-liquid heat exchanger upon detection of a failure at one MCU of the at least two MCUs, wherein when operational, the at least two MCUs provide cooled system coolant in parallel to the at least one heat-generating electronics subsystem, for liquid cooling thereof, and to the air-to-liquid heat exchanger for exclusively cooling air passing through the electronics rack, and wherein responsive to detection of failure at one MCU of the at least two MCUs, the at least one controller employs the at least one isolation valve to automatically shut off flow of system coolant through the air-to-liquid heat exchanger, while system coolant continues to flow via at least one remaining operational MCU to the at least one heat-generating electronics subsystem for continued liquid cooling thereof.

2. The system of claim 1, further comprising a system coolant supply manifold and a system coolant return manifold associated with the electronics rack, the system coolant supply manifold and system coolant return manifold each being coupled in fluid communication with the at least two MCUs for facilitating providing of system coolant to the at least one heat-generating electronics subsystem, and wherein the air-to-liquid heat exchanger is coupled via a coolant supply line to the system coolant supply manifold for receiving system coolant from the system coolant supply manifold and via a coolant return line to the system coolant return manifold for exhausting system coolant to the system coolant return manifold, and wherein when operational, the at least two MCUs provide cooled system coolant in parallel to the system coolant supply manifold and receive exhausted system coolant in parallel from the system coolant return manifold, and the system coolant supply manifold supplies cooled system coolant in parallel to the at least one heat-generating electronics subsystem and the air-to-liquid heat exchanger.

3. The system of claim 2, wherein the at least two modular cooling units comprise a first modular cooling unit and a second modular cooling unit, and wherein the at least one controller comprises a first modular cooling unit control and a second modular cooling unit control, wherein the first modular cooling unit control and the second modular cooling unit control respectively monitor operation of the first modular cooling unit and the second modular cooling unit.

4. The system of claim 3, further comprising a first temperature sensor disposed for sensing system coolant temperature in the second coolant loop of the first modular cooling unit between the liquid-to-liquid heat exchanger thereof and the system coolant supply manifold, and a second temperature sensor disposed for sensing system coolant temperature in the second coolant loop of the second modular cooling unit between the liquid-to-liquid heat exchanger thereof and the system coolant supply manifold, wherein temperature of system coolant outside a defined temperature range is identified by the first modular cooling unit control or the second modular cooling unit control as failure of the respective first modular cooling unit or second modular cooling unit.

5. The system of claim 4, wherein the at least one isolation valve comprises a first isolation valve and a second isolation valve, the first isolation valve being controlled by the first modular cooling unit control, and the second isolation valve being controlled by the second modular cooling unit control, wherein the first modular cooling unit control facilitates detecting, via the first temperature sensor, a system coolant temperature outside the defined temperature range, and responsive thereto, closing of the first isolation valve to shut off flow of system coolant through the air-to-liquid heat exchanger, and the second modular cooling unit control facilitates detecting, via the second temperature sensor, a system coolant temperature outside the defined temperature range, and responsive thereto, closing of the second isolation valve to shut off flow of system coolant through the air-to-liquid heat exchanger.

6. The system of claim 5, wherein the first isolation valve is coupled to the coolant supply line for facilitating automatic shut off of system coolant flow to the air-to-liquid heat exchanger responsive to system coolant temperature sensed by the first temperature sensor being outside the defined temperature range, and the second isolation valve is coupled to the coolant return line for facilitating automatic shut off of system coolant flow through the air-to-liquid heat exchanger when system coolant temperature sensed by the second temperature sensor is outside the defined temperature range.

7. The system of claim 3, wherein the at least one controller further comprises a system controller, the system controller being coupled to the first modular cooling unit control and to the second modular cooling unit control, the system controller facilitating shut down of at least one failing MCU of the at least two MCUs.

8. The system of claim 1, wherein the air-to-liquid heat exchanger is disposed at the air outlet side of the electronics rack for exclusively cooling air egressing from the electronics rack, and wherein the electronics rack further comprises at least one air-moving device for facilitating external airflow through the electronics rack, the air-to liquid heat exchanger lowering temperature of air egressing into a data center containing the electronics rack, thereby eliminating air-conditioning requirements for the data center, and wherein the electronics rack further comprises multiple heat-generating electronics subsystems, each heat-generating electronics subsystem comprising at least one heat-generating electronics component, and wherein the system further comprises multiple cooling subsystems, each cooling subsystem including at least one liquid-cooled cold plate, each liquid-cooled cold plate being associated with a respective heat-generating electronics component of a respective heat-generating electronics subsystem of the multiple heat-generating electronics subsystems for facilitating cooling thereof.

9. The system of claim 8, further comprising a system coolant supply manifold and a system coolant return manifold supported by the electronics rack and disposed at the air inlet side thereof, the system coolant supply manifold and system coolant return manifold each being coupled in fluid communication with the at least two MCUs for facilitating providing of system coolant to the multiple cooling subsystems, and wherein the air-to-liquid heat exchanger is coupled via a coolant supply line to the system coolant supply manifold for receiving system coolant from the system coolant supply manifold and is coupled via a coolant return line to the system coolant return manifold for exhausting system coolant to the system coolant return manifold, and wherein the at least two MCUs are disposed in a lower portion of the electronics rack, and when operational, the at least two MCUs provide cooled system coolant in parallel to the system coolant supply manifold and receive exhausted system coolant in parallel from the system coolant return manifold, and the system coolant supply manifold supplies cooled system coolant in parallel to the multiple cooling subsystems and the air-to-liquid heat exchanger.

10. A data center comprising:
a plurality of electronics racks, each electronics rack comprising at least one heat-generating electronics subsystem, and an air inlet side and an air outlet side for respectively enabling ingress and egress of external air; and
a plurality of cooling systems, each cooling system being associated with a respective electronics rack, and comprising:
at least two modular cooling units (MCUs) associated with the electronics rack and configured to provide system coolant in parallel to the at least one heat-generating electronics subsystem for facilitating cooling thereof, wherein each MCU of the at least two MCUs comprises a liquid-to-liquid heat exchanger, a first coolant loop and a second coolant loop, and when operational, the first coolant loop of each MCU receives chilled coolant from a source and passes at least a portion thereof through the liquid-to-liquid heat exchanger, and the second coolant loop provides cooled system coolant to the at least one heat-generating electronics subsystem, and expels heat in the liquid-to-liquid heat exchanger from the at least one heat-generating electronics subsystem of the associated electronics rack to the chilled coolant in the first coolant loop;
an air-to-liquid heat exchanger associated with the electronics rack for exclusively cooling air passing through the electronics rack, the air-to-liquid heat exchanger being coupled to receive system coolant from the at least two MCUs and exhaust system coolant to the at least two MCUs, wherein said air-to-liquid heat exchanger cools air passing through the electronics rack exclusive of outside-of-rack conditioned air units;
at least one isolation valve coupled to selectively shut off the flow of system coolant through the air-to-liquid heat exchanger; and
at least one controller coupled to the at least one isolation valve for automatically shutting off flow of system coolant through the air-to-liquid heat exchanger upon detection of a failure at one MCU of the at least two MCUs, wherein when operational, the at least two MCUs provide cooled system coolant in parallel to the at least one heat-generating electronics subsystem of the associated electronics rack, for liquid cooling thereof, and to the air-to-liquid heat exchanger for cooling at least a portion of air passing through the associated electronics rack, and wherein responsive to detection of failure at one MCU of the at least two MCUs, the at least one controller employs the at least one isolation valve to automatically shut off flow of system coolant through the air-to-liquid heat exchanger, while system coolant continues to flow via at least one remaining operational MCU to the at least one heat-generating electronics subsystem of the associated electronics rack for continued liquid cooling thereof.

11. The data center of claim 10, wherein the at least two modular cooling units of each cooling system comprise a first modular cooling unit and a second modular cooling unit, and wherein each cooling system further comprises a first temperature sensor and a second temperature sensor, the first temperature sensor being disposed for sensing coolant temperature in the second coolant loop of the first modular cooling unit near an outlet of the liquid-to-liquid heat exchanger thereof, and the second temperature sensor being disposed for sensing system coolant temperature in the second coolant loop of the second modular cooling unit near an outlet of the liquid-to-liquid heat exchanger thereof, wherein a sensed system coolant temperature outside a defined temperature range represents failure of the respective first modular cooling unit or second modular cooling unit.

12. The data center of claim 11, wherein the at least one isolation valve of each cooling system comprises a first isolation valve and a second isolation valve, the first isolation valve and the second isolation valve each being disposed for facilitating shut off of system coolant flow through the air-to-liquid heat exchanger responsive to the at least one controller detecting failure at the first modular cooling unit or second modular cooling unit.

13. The data center of claim 12, wherein each cooling system further comprises a system coolant supply manifold and a system coolant return manifold, the system coolant supply manifold and system coolant return manifold each being coupled in fluid communication with the at least two MCUs for facilitating providing of system coolant to the at least one heat-generating electronics subsystem of the associated electronics rack, and wherein the air-to-liquid heat exchanger is coupled via a coolant supply line to the system coolant supply manifold for receiving system coolant from the system coolant supply manifold and is coupled via a coolant return line to a system coolant return manifold for exhausting system coolant to the system coolant return manifold, and wherein when operational, the at least two MCUs provide cooled system coolant in parallel to the system coolant supply manifold and receive exhausted system coolant in parallel from the system coolant return manifold, the system coolant supply manifold supplying cooled system coolant to the at least one heat-generating electronics subsystem of the associated electronics rack and to the air-to-liquid heat exchanger, and wherein the first isolation valve and the second isolation valve are disposed in fluid communication with at least one of the coolant supply line or coolant return line.

14. A method of facilitating cooling of an electronics rack, the method comprising:
cooling at least one heat-generating electronics subsystem of an electronics rack, the electronics rack comprising an air inlet side and an air outlet side respectively enabling ingress and egress of external air, the cooling comprising:
employing at least two modular cooling units (MCUs) in association with the electronics rack to provide system coolant in parallel to the at least one heat-generating electronics subsystem thereof, each MCU of the at least two MCUs including a liquid-to-liquid heat exchanger, a first coolant loop and a second coolant loop, and when operational, the first coolant loop of each MCU receives chilled coolant from a source and passes at least a portion thereof through the liquid-to-liquid heat exchanger, and the second coolant loop facilitates providing cooled system coolant to the at least one heat-generating electronics subsystem of the electronics rack, and expels heat in the liquid-to-liquid heat exchanger from the at least one heat-generating electronics subsystem to the chilled coolant in the first coolant loop; and
utilizing an air-to-liquid heat exchanger disposed in association with the electronics rack to exclusively cool air passing through the electronics rack, the air-to-liquid heat exchanger being coupled to receive system coolant from the at least two MCUs and exhaust system coolant to the at least two MCUs, wherein said air-to-liquid heat exchanger cools air passing through the electronics rack exclusive of outside-of-rack conditioned air units; and
monitoring for failure of an MCU of the at least two MCUs; and upon detection of failure of one MCU of the at least two MCUs, automatically shutting off system coolant flow through the air-to-liquid heat exchanger while continuing to provide system coolant flow, via at least one remaining operational MCU, to the at least one heat-generating electronics subsystem for continued liquid cooling thereof.

15. The method of claim 14, further comprising automatically determining which MCU of the at least two MCUs is failing, and automatically shutting down the failing MCU, while continuing to operate the at least one remaining operational MCU to provide cooled system coolant to the at least one heat-generating electronics subsystem of the electronics rack for liquid cooling thereof.

16. The method of claim 14, wherein the employing further comprises employing a system coolant supply manifold and a system coolant return manifold in association with the electronics rack, the system coolant supply manifold and system coolant return manifold each being coupled in fluid communication with the at least two modular cooling units for facilitating providing of system coolant to the at least one heat-generating electronics subsystem, and wherein the utilizing further comprises providing system coolant from the system coolant supply manifold to the air-to-liquid heat exchanger via a coolant supply line and exhausting system coolant from the air-to-liquid heat exchanger to the system coolant return manifold via a coolant return line, wherein at least one of the coolant supply line or coolant return line has associated therewith at least one isolation valve for facilitating the automatic shut off of system coolant flow through the air-to-liquid heat exchanger responsive to detecting a failure at one MCU of the at least two MCUs.

17. The method of claim 16, wherein the monitoring further comprises monitoring a first system coolant temperature in a second coolant loop of a first MCU of the at least two MCUs between the liquid-to-liquid heat exchanger thereof and the system coolant supply manifold, and monitoring a second system coolant temperature in a second coolant loop of a second MCU of the at least two MCUs between the liquid-to-liquid heat exchanger thereof and the system coolant supply manifold, wherein when the first system coolant temperature or the second system coolant temperature is outside a defined temperature range, the respective first or second MCU of the at least two MCUs is identified as failing and is automatically shut off, as is system coolant flow through the air-to-liquid heat exchanger.

18. The method of claim 16, wherein automatically shutting off comprises employing at least one of a first isolation valve or a second isolation valve, the first isolation valve being associated with a first MCU of the at least two MCUs, and the second isolation valve being associated with a second MCU of the at least two MCUs, in wherein the automatically shutting off further comprises automatically closing the first isolation valve upon detection of failure at the first MCU or automatically closing the second isolation valve upon detection of failure of the second MCU.

19. The method of claim 18, further comprising issuing an alarm signal to indicate cooling shut down upon failure of both the first MCU and the second MCU.

20. The method of claim 14, wherein the monitoring further comprises waiting a time subsequent to shut off of system coolant flow through the air-to-liquid heat exchanger, and thereafter, sensing system coolant temperature in at least one second coolant loop of the at least two MCUs and determining whether the sensed system coolant temperature is within a defined temperature range, and if not, signaling to shut down the at least one MCU comprising the at least one second coolant loop containing the sensed system coolant temperature.

* * * * *